(12) United States Patent
Matsuo et al.

(10) Patent No.: US 12,388,415 B2
(45) Date of Patent: Aug. 12, 2025

(54) CRYSTAL UNIT, SEMIMANUFACTURED CRYSTAL UNIT, AND METHOD FOR MANUFACTURING CRYSTAL UNIT

(71) Applicant: NIHON DEMPA KOGYO CO., LTD., Tokyo (JP)

(72) Inventors: Kiyoharu Matsuo, Saitama (JP); Takahiro Ohtsuka, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 751 days.

(21) Appl. No.: 17/751,670

(22) Filed: May 24, 2022

(65) Prior Publication Data

US 2022/0385269 A1 Dec. 1, 2022

(30) Foreign Application Priority Data

May 28, 2021 (JP) .................................. 2021-090496
Feb. 1, 2022 (JP) .................................. 2022-013832

(51) Int. Cl.
*H03H 9/19* (2006.01)
*H03H 3/04* (2006.01)

(52) U.S. Cl.
CPC ................ *H03H 9/19* (2013.01); *H03H 3/04* (2013.01); *H03H 2003/0421* (2013.01)

(58) Field of Classification Search
CPC .... H03H 9/19; H03H 3/04; H03H 2003/0421; H03H 2003/0457; H03H 9/02157; H03H 9/1021; H03H 9/02062; H03H 9/17; H03H 9/131; H03H 2003/0435
See application file for complete search history.

(56) References Cited

U.S. PATENT DOCUMENTS

| | | | | |
|---|---|---|---|---|
| 3,872,411 A | * | 3/1975 | Watanabe | H03H 9/19 29/25.35 |
| 2005/0151450 A1 | * | 7/2005 | Umeki | H03H 9/171 310/367 |
| 2010/0001621 A1 | * | 1/2010 | Yamada | H03H 9/02157 310/365 |
| 2013/0328452 A1 | * | 12/2013 | Fujihara | H10N 30/875 216/13 |

FOREIGN PATENT DOCUMENTS

| | | | | |
|---|---|---|---|---|
| CN | 1960178 A | * | 5/2007 | ......... H03H 9/02157 |
| EP | 1909391 B1 | * | 8/2009 | ......... H03H 9/02157 |
| JP | 2005130071 A | * | 5/2005 | |
| JP | 5216210 B2 | * | 6/2013 | ........... H03H 9/0547 |
| JP | 2020025344 | | 2/2020 | |
| JP | 2020025344 A | * | 2/2020 | |

* cited by examiner

*Primary Examiner* — Mohamad A Musleh
(74) *Attorney, Agent, or Firm* — JCIPRNET

(57) ABSTRACT

A crystal unit includes a crystal element, excitation electrodes, and a container. The crystal element vibrates in a thickness-shear mode. The excitation electrodes are disposed on front and back surfaces of the crystal element. The crystal element is mounted to the container. The excitation electrodes are disposed on the crystal element. When a thickness of the crystal element is expressed as T, and a total thickness of the excitation electrodes disposed on the front and back surfaces of the crystal element is expressed as t, a ratio t/T is from 0.026 to 0.030.

16 Claims, 14 Drawing Sheets

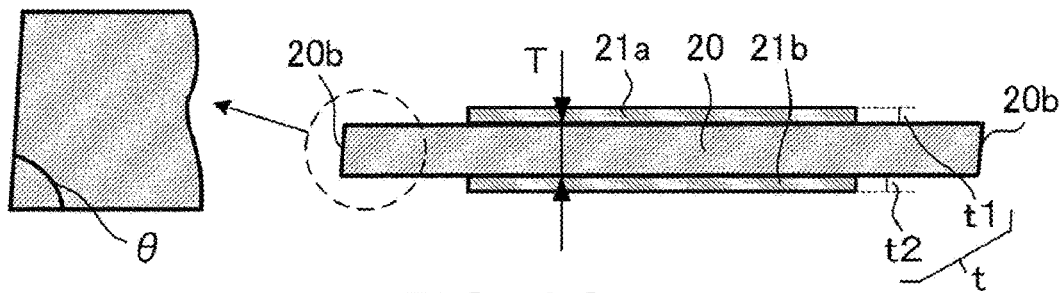
FIG. 2C
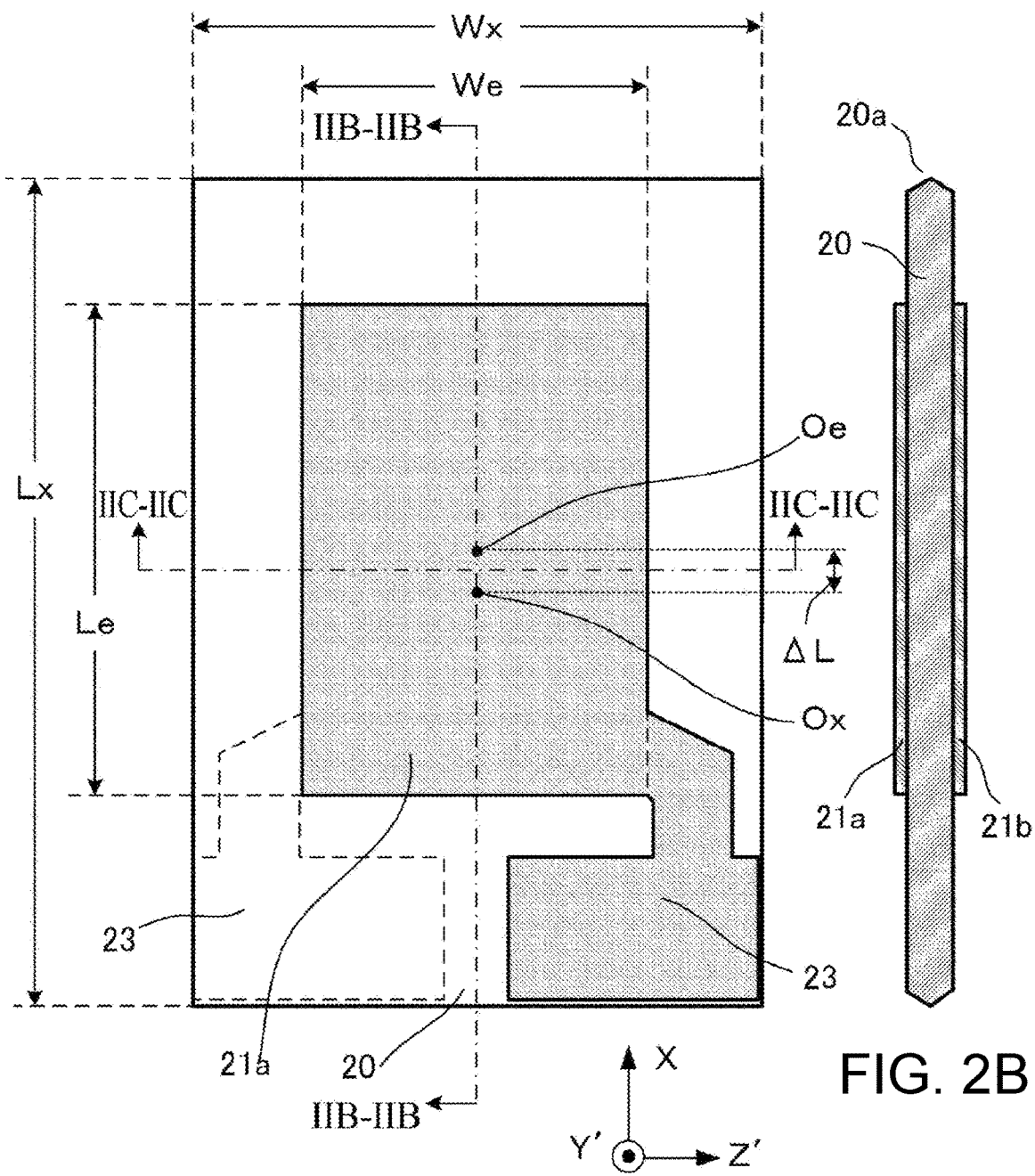
FIG. 2B
FIG. 2A

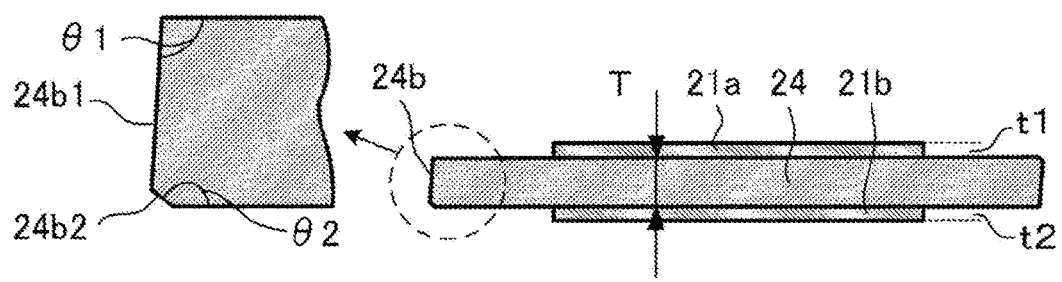
FIG. 3C
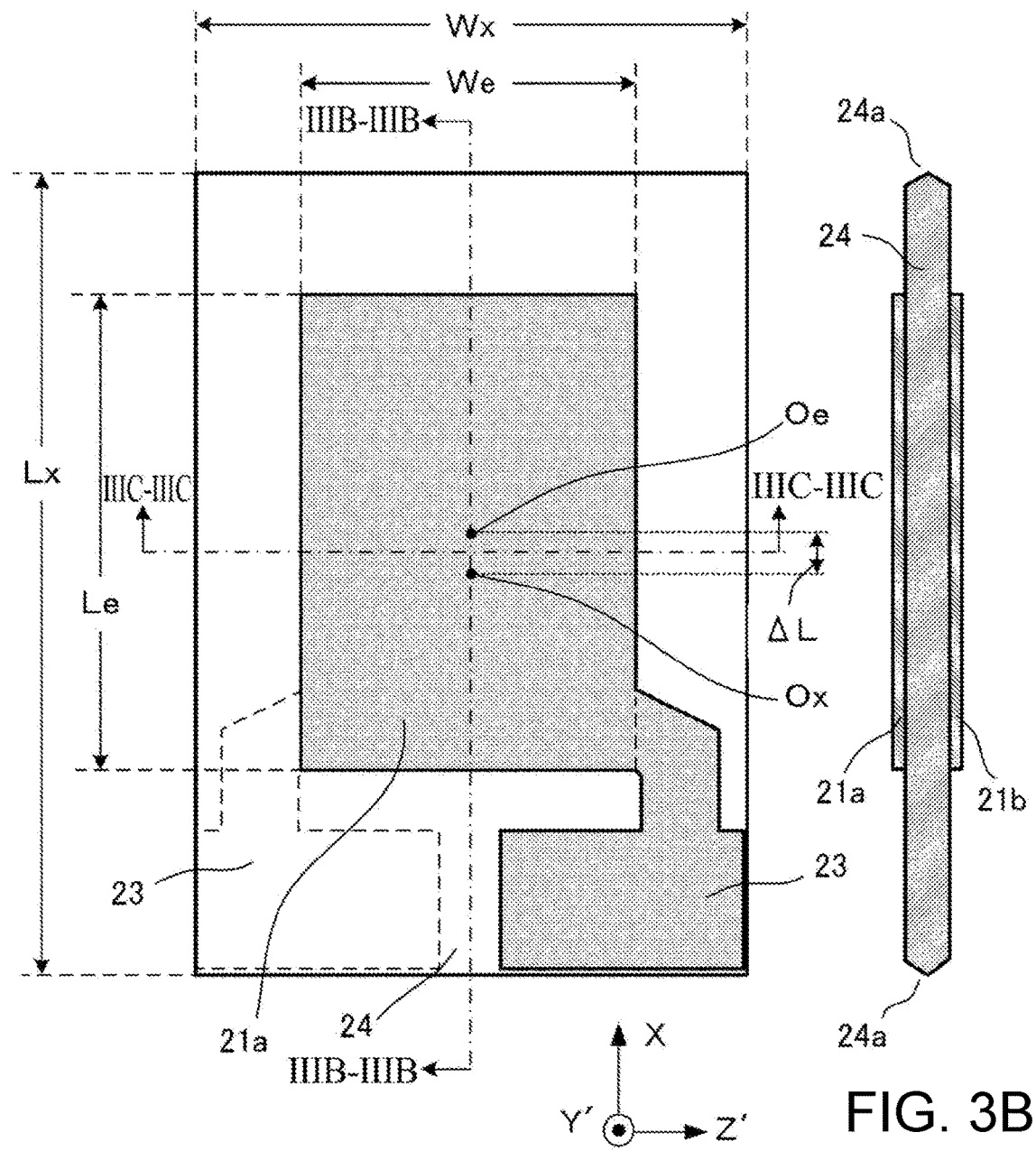
FIG. 3B
FIG. 3A

CRYSTAL UNIT, SEMIMANUFACTURED CRYSTAL UNIT, AND METHOD FOR MANUFACTURING CRYSTAL UNIT

CROSS-REFERENCE TO RELATED APPLICATIONS

This application is based on and claims priority under 35 U.S.C. § 119 to Japanese Patent Application Nos. 2021-090496 filed on May 28, 2021, and 2022-013832 filed on Feb. 1, 2022, the entire contents of which are incorporated herein by reference.

TECHNICAL FIELD

This disclosure relates to a crystal unit that vibrates in a thickness-shear mode and is excellent in drive level characteristics, a semimanufactured crystal unit for the crystal unit, and a method for manufacturing the crystal unit.

DESCRIPTION OF THE RELATED ART

Since a crystal unit is used as a reference frequency source, the crystal unit is required to vibrate at a constant frequency as much as possible. Therefore, it is preferred that the fluctuation of the frequency is small even when a driving power of the crystal unit changes, that is, excellent in drive level characteristics. The same requirement applies to a crystal element that vibrates in a thickness-shear mode, for example, a crystal unit configured using an AT-cut crystal element.

Japanese Unexamined Patent Application Publication No. 2020-25344 discloses an AT-cut crystal element that includes excitation electrodes on front and back surfaces. In the AT-cut crystal element, the excitation electrode has a stacked structure of a lower layer and an upper layer, and the upper layer is small sized so as to be disposed within an outer edge of the lower layer in plan view, thus attempting to improve the drive level characteristics of a crystal unit using the AT-cut crystal element (for example, claim 1, claim 2, FIG. 1 of Japanese Unexamined Patent Application Publication No. 2020-25344).

Specifically, in forming a two-layered excitation electrode including a lower layer made of chrome (Cr) and an upper layer made of gold (Au) by a photolithography technique, patterning of an Au film and a Cr film are sequentially performed, and then, the Au film is etched again, thus forming a crystal element with a structure in which the gold layer is disposed within an outer edge of the chrome layer (structure in which the gold layer is not overhung) (for example, paragraph 0049 of Japanese Unexamined Patent Application Publication No. 2020-25344).

In the crystal unit disclosed in Japanese Unexamined Patent Application Publication No. 2020-25344, the excitation electrode with a high adhesion between the upper layer and the lower layer can be formed on the crystal element due to the gold layer that is not overhung, thereby attempting to improve the drive level characteristics (for example, paragraph 0034 of Japanese Unexamined Patent Application Publication No. 2020-25344).

Meanwhile, the inventor of the application also has seriously examined a technique to improve drive level characteristics of a crystal unit that vibrates in a thickness-shear mode, especially a crystal unit configured using an AT-cut crystal element. Consequently, the inventor found a new feature for improving the drive level characteristics, and achieved the present disclosure.

A need thus exists for a crystal unit, a semimanufactured crystal unit, and a method for manufacturing the crystal unit which allows at least a part of the features mentioned above.

SUMMARY

According to an aspect of this disclosure, there is provided a crystal unit that includes a crystal element, excitation electrodes, and a container. The crystal element vibrates in a thickness-shear mode. The excitation electrodes are disposed on front and back surfaces of the crystal element. The crystal element is mounted to the container. The excitation electrodes are disposed on the crystal element. When a thickness of the crystal element is expressed as T, and a total thickness of the excitation electrodes disposed on the front and back surfaces of the crystal element is expressed as t, a ratio t/T is from 0.026 to 0.030.

BRIEF DESCRIPTION OF THE DRAWINGS

The foregoing and additional features and characteristics of this disclosure will become more apparent from the following detailed description considered with reference to the accompanying drawings, wherein:

FIG. 2A to FIG. 2C are explanatory drawings of a crystal element 20 included in the crystal unit 10 of the first embodiment;

FIG. 3A to FIG. 3C are explanatory drawings of a crystal element 24 included in a crystal unit of a second embodiment;

DETAILED DESCRIPTION

Figure 1A:
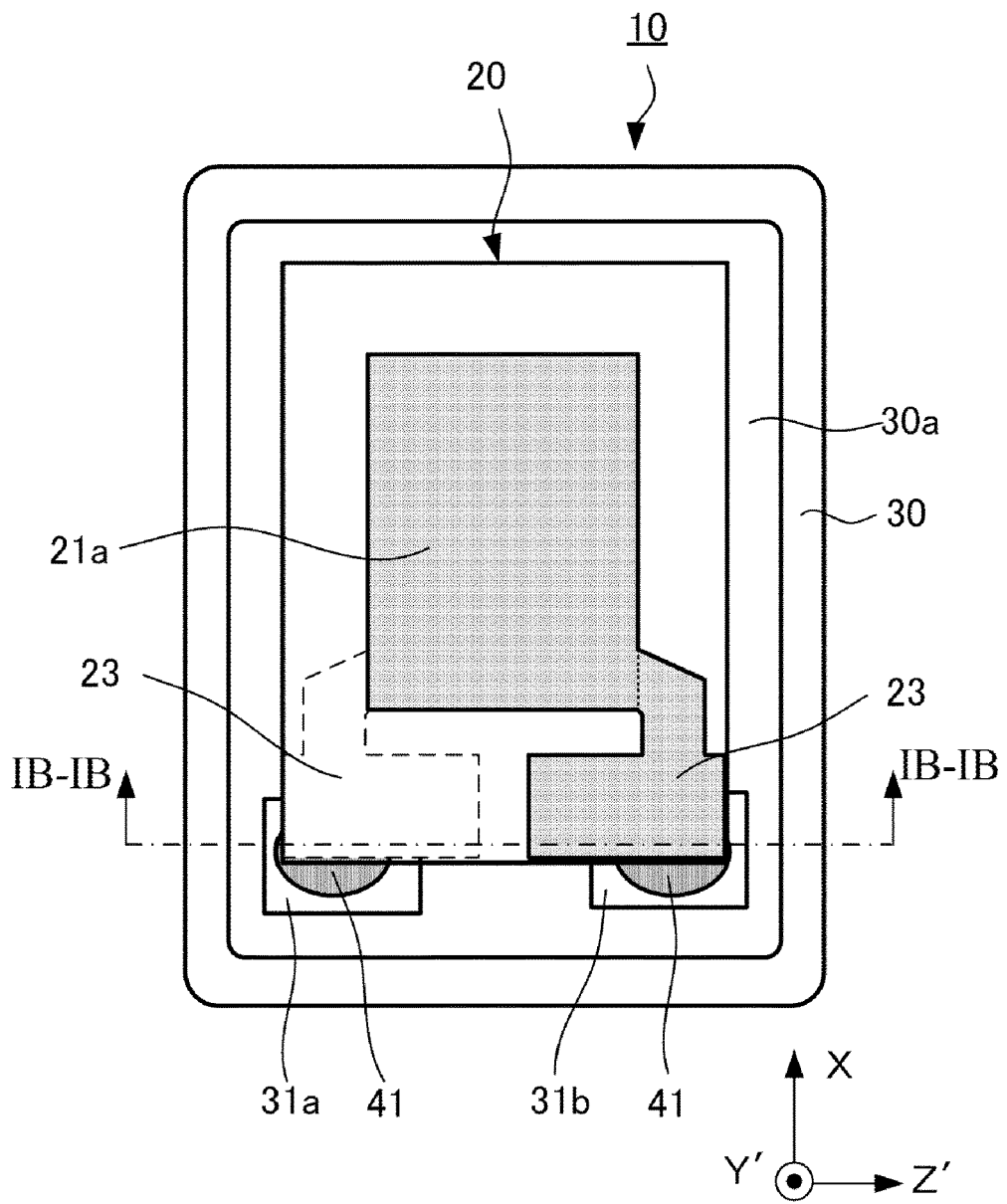
FIG. 1A and FIG. 1B are drawings for describing a crystal unit 10 of a first embodiment.

The following describes embodiments of a crystal unit, a semimanufactured crystal unit, and a method for manufacturing the crystal unit of the present disclosure with reference to the drawings. Each drawing used in the description is merely illustrated schematically for understanding this disclosure. In each drawing used in the description, the same reference numeral is attached to the similar component, and its explanation is omitted in some cases. Shapes, dimensions, materials, and the like described in the following explanations are merely preferable examples within the scope of this disclosure. Therefore, this disclosure is not limited to only the following embodiments.

1. Embodiments of Crystal Unit

Figure 1B:
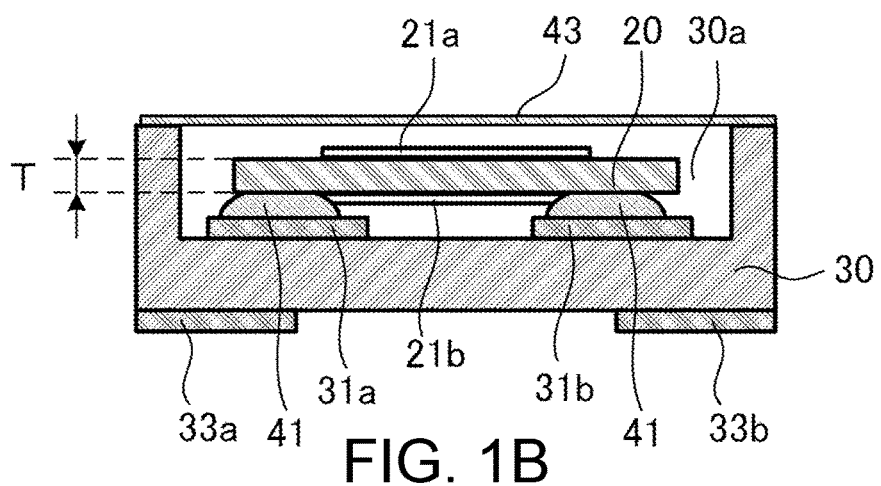

1-1. First Embodiment of Crystal Unit (Whole Outline) FIG. 1A and FIG. 1B are explanatory drawings of a crystal unit 10 of the first embodiment. Especially, FIG. 1A is a plan view of the crystal unit 10, and FIG. 1B is a sectional drawing taken along the line IB-IB in FIG. 1A.

The crystal unit 10 of the first embodiment includes a crystal element 20 that vibrates in a thickness-shear mode, excitation electrodes 21a, 21b disposed on front and back surfaces of the crystal element 20, and a container 30 to which the crystal element 20 including the excitation electrodes 21a, 21b is mounted. Coordinate axes X, Y', and Z' illustrated in FIG. 1A indicate respective crystallographic axes of a crystal. Hereinafter, one of the excitation electrodes 21a, 21b is referred to as a first excitation electrode 21a, and the other is referred to as a second excitation electrode 21b in some cases.

In this case, the crystal element 20 is an AT-cut crystal element having a rectangular planar shape, and is a crystal element having long sides parallel to the X-axis of the crystal and short sides parallel to the Z'-axis of the crystal. The AT-cut crystal element itself is described in detail in, for example, a document: "Handbook of Quartz Crystal Device" (Fourth Edition, page 7 or other pages, published by Quartz Crystal Industry Association of Japan, March 2002). Therefore, the explanation will be omitted here.

The crystal element 20 includes an extraction electrode 23 extracted to one short side of the crystal element 20 from each of the first excitation electrode 21a and the second excitation electrode 21b. The container 30 is a ceramic container provided with a depressed portion 30a to which the crystal element 20 is mounted. The container 30 includes connection pads 31a, 31b at predetermined positions on a bottom surface of the depressed portion 30a, and includes external connecting terminals 33a, 33b on an outer bottom surface.

The crystal element 20 is connected and fixed to the connection pads 31a, 31b at the positions of the extraction electrode 23 by a conductive adhesive 41. The connection pads 31a, 31b are connected to the external connecting terminals 33a, 33b by a via-wiring and/or a castellation (not illustrated).

The container 30 is sealed by a lid member 43 at a top surface of a dike in a periphery of the depressed portion 30a of the container 30. The lid member 43 is not illustrated in FIG. 1A.

(Description of Features) Next, features of the present disclosure will be described with reference to FIG. 2A to FIG. 2C. FIG. 2A to FIG. 2C are drawings illustrating enlarged parts extracted from the crystal element 20 and the excitation electrodes 21a, 21b illustrated in FIG. 1A and FIG. 1B. FIG. 2A is a plan view of the crystal element and the excitation electrode, FIG. 2B is a sectional drawing taken along the line IIB-IIB in FIG. 2A, and FIG. 2C is a sectional drawing taken along the line IIC-IIC in FIG. 2A.

The crystal element 20 included in the crystal unit 10 of the first embodiment is the AT-cut crystal element 20 having a rectangular shape in plan view and a thickness T. The thickness T of the crystal element 20 is a thickness of a flat plate when the crystal element is a simple flat plate as this example. In a case of a mesa structure in which the crystal element is partially projected, the thickness T is a thickness of the mesa portion. In the crystal element 20 of the first embodiment, each of side surfaces 20a intersecting with the X-axis of the crystal includes two surfaces projecting outward (see FIG. 2B), and each of surfaces 20b intersecting with the Z'-axis of the crystal is one surface having an angle θ with a principal surface of the crystal element 20. Here, the angle θ is in a range of from 85 to 89 degrees while slightly changing depending on an etching period with a hydrofluoric acid based etchant in the manufacture of the crystal element 20. Therefore, the angle between another principal surface of the crystal element 20 and the surface 20b is in a range of from 95 to 91 degrees. The crystal element 20 has a long side dimension Lx, and a short side dimension Wx. Specific examples of the length of the long side and the length of the short side will be described in detail in experiments described below.

When each of the surfaces 20b intersecting with the Z'-axis of the crystal is one surface having the angle θ with the principal surface of the crystal element 20, it is considered that the characteristic variation of the crystal unit is reduced because there is no dimension change caused by the production variation of a side surface 24b2 illustrated in FIG. 3C compared with the case where the side surface includes two surfaces as illustrated in FIG. 3C.

Each of the first excitation electrode 21a and the second excitation electrode 21b has a rectangular planar shape, the long sides are parallel to the long sides of the crystal element 20, and the short sides are parallel to the short sides of the crystal element 20. The first excitation electrode 21a and the second excitation electrode 21b have the same long side dimensions Le and the same short side dimensions We between both electrodes. The first excitation electrode 21a and the second excitation electrode 21b are disposed to be opposed with the crystal element 20 interposed therebetween.

A planar center Oe of the first excitation electrode 21a and the second excitation electrode 21b is decentered to an opposite side of the extraction electrode 23 of the crystal element 20, that is, to a distal end of the crystal element 20 by AL with respect to a planar center Ox of the crystal element 20. The first excitation electrode 21a has a thickness t1, and the second excitation electrode 21b has a thickness t2. Therefore, a total thickness t of the excitation electrodes is t=t1+t2. The thickness t1 and the thickness t2 may be the same, or may be different.

In the crystal element 20 included in the crystal unit 10 of the first embodiment, a ratio t/T between the thickness T of the crystal element 20 and the total thickness t of the first excitation electrode 21a and the second excitation electrode 21b is set to a value in a range of from 0.026 to 0.030.

Alternatively, in the disclosure of the crystal unit in a proposed another aspect, when a mass of the crystal in a region of the crystal element 20 where the excitation electrodes 21a, 21b are disposed is expressed as M, and a mass of the excitation electrodes 21a, 21b in the region where the excitation electrodes 21a, 21b are disposed is expressed as m, a ratio m/M may be a value in a range of from 0.192 to 0.216. The meanings of the numerical ranges of the ratios t/T and m/M will be described in detail in "Experiment and Examination" described later.

1-2. Second Embodiment of Crystal Unit

FIG. 3A to FIG. 3C are explanatory drawings focusing on especially a crystal element 24 of the crystal unit of the second embodiment. FIG. 3A is a plan view of the crystal element and the excitation electrode, FIG. 3B is a sectional drawing taken along the line IIIB-IIIB in FIG. 3A, and FIG. 3C is a sectional drawing taken along the line IIIC-IIIC in FIG. 3A.

The crystal element 24 included in the crystal unit of the second embodiment is different from the crystal element 20 included in the crystal unit of the first embodiment in a structure of a side surface 24b intersecting with the Z'-axis of the crystal. That is, while the side surface 20b (see FIG. 2C) is configured of one surface having the angle θ with the principal surface in the crystal element 20 described in the first embodiment, the side surface 24b (FIG. 3C) is configured of two surfaces of a first surface 24b1 and a second surface 24b2 in the case of the crystal element 24 of the second embodiment. The first surface 24b1 intersects with one principal surface of the crystal element 24 with an interior angle of an angle θ1, and the second surface 24b2 intersects with the other principal surface of the crystal element 24 with an interior angle of an angle θ2. Here, the angle θ1 is from 90° to 94°, preferably from 90° to 92°29', and the angle θ2 is approximately 147°. The second surface 24b2 may be an m surface as a crystal face of the crystal. A side surface 24a intersecting with the X-axis of the crystal of the crystal element 24 is configured of two surfaces similarly to the side surface 20a of the crystal element 20 in the first the embodiment.

1-3. Third Embodiment of Crystal Unit

Figure 4A:
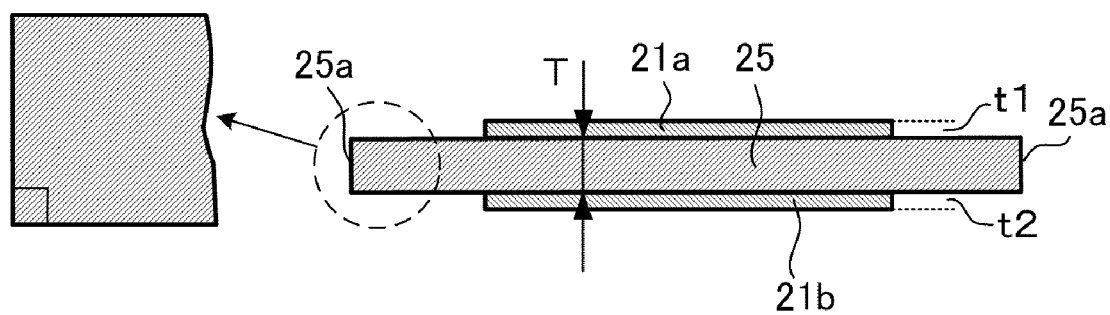
FIG. 4A is an explanatory drawing of a crystal element 25 included in a crystal unit of a third embodiment.

FIG. 4A is an explanatory drawing of a crystal element 25 of the third embodiment, and is a sectional drawing of the crystal element 25 taken along the line similar to the line IIC-IIC in FIG. 2A.

The crystal element 25 of the third embodiment is different from the embodiments described above in that a side surface 25a intersecting with the Z'-axis of the crystal is configured of one surface perpendicular to a principal surface of the crystal element 25.

1-4. Fourth Embodiment of Crystal Unit

Figure 4B:
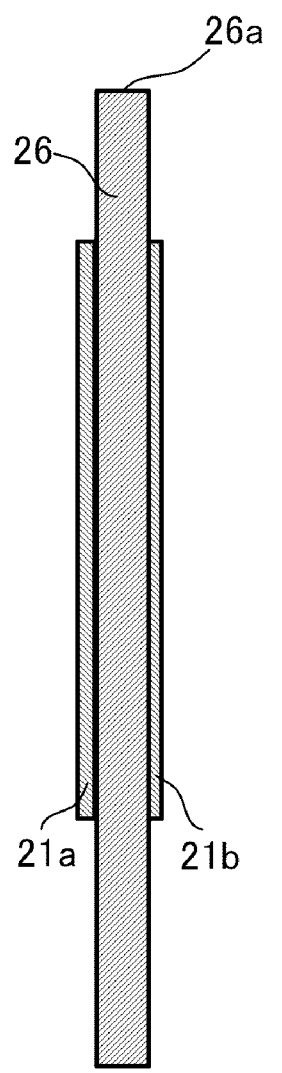
FIG. 4B is an explanatory drawing of a crystal element 26 included in a crystal unit of a fourth embodiment.

FIG. 4B is an explanatory drawing of a crystal element 26 of the fourth embodiment, and is a sectional drawing corresponding to a cross-sectional surface of the crystal element 26 taken along the line similar to the line IIB-IIB in FIG. 2A.

The crystal element 26 of the fourth embodiment is different from the embodiments described above in that a side surface 26a intersecting with the X-axis of the crystal is configured of one surface perpendicular to a principal surface of the crystal element 26.

1-5. Fifth Embodiment and Sixth Embodiment of Crystal Unit

Figure 4C:
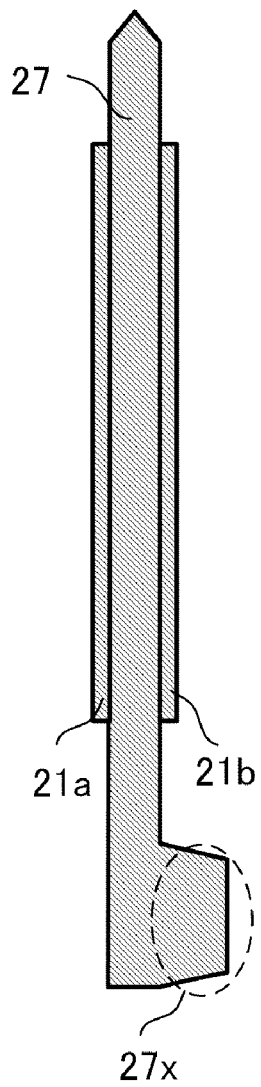
FIG. 4C is an explanatory drawing of a crystal element 27 included in a crystal unit of a fifth embodiment.

FIG. 4C is an explanatory drawing of a crystal element 27 of the fifth embodiment, and is a sectional drawing of the crystal element 27 taken along the line similar to the line IIB-IIB in FIG. 2A.

Figure 4D:
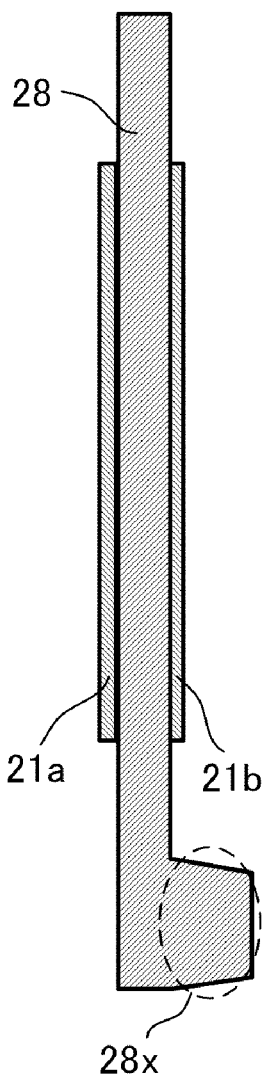
FIG. 4D is an explanatory drawing of a crystal element 28 included in a crystal unit of a sixth embodiment.

FIG. 4D is an explanatory drawing of a crystal element 28 of the sixth embodiment, and is a sectional drawing of the crystal element 28 taken along the line similar to the line IIB-IIB in FIG. 2A.

The crystal element 27 of the fifth embodiment and the crystal element 28 of the sixth embodiment are different from the embodiments described above in that the crystal element 27 and the crystal element 28 respectively include extruding parts 27x, 28x projecting in the Y'-direction of the crystal at one ends in the X-axis direction of the crystal. The extruding parts 27x, 28x are used as fixing portions to fix the crystal elements 27, 28 to the container 30 (see FIG. 1A and FIG. 1B). When the extruding parts 27x, 28X are disposed, the influence on the crystal element from the container side can reduced compared with the case where the extruding parts 27x, 28X are not disposed, thus allowing the attempt of improving the characteristics of the crystal unit. In the fifth embodiment and the sixth embodiment, respective long side dimensions Lx of the crystal elements 27, 28 are dimensions including the parts at which the extruding parts 27x, 28x are disposed. Dimensions of the extruding parts 27x, 28x along the X-axis of the crystal are dimensions, for example, corresponding to a design in a range of from 0.1 mm to 0.2 mm.

The crystal element 27 of the fifth embodiment is an example in which the side surface of the crystal element 27 (that is, distal end of the crystal element 27) intersecting with the X-axis of the crystal is configured of two surfaces. The crystal element 28 of the sixth embodiment is an example in which the side surface of the crystal element 28 (that is, distal end of the crystal element 28) intersecting with the X-axis of the crystal is configured of one surface perpendicular to the principal surface of the crystal element 28. In the crystal elements including the extruding parts 27x, 28x, the side surface shape of the crystal element is not limited to the structure illustrated in FIG. 4C or FIG. 4D, and may be other structures.

2. Embodiment of Semimanufactured Crystal Unit

Figure 5A:
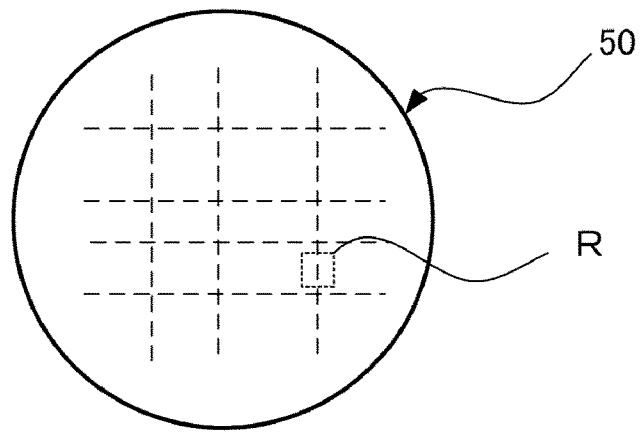
FIG. 5A and FIG. 5B are explanatory drawings of a semimanufactured crystal unit 50.
Figure 5B:
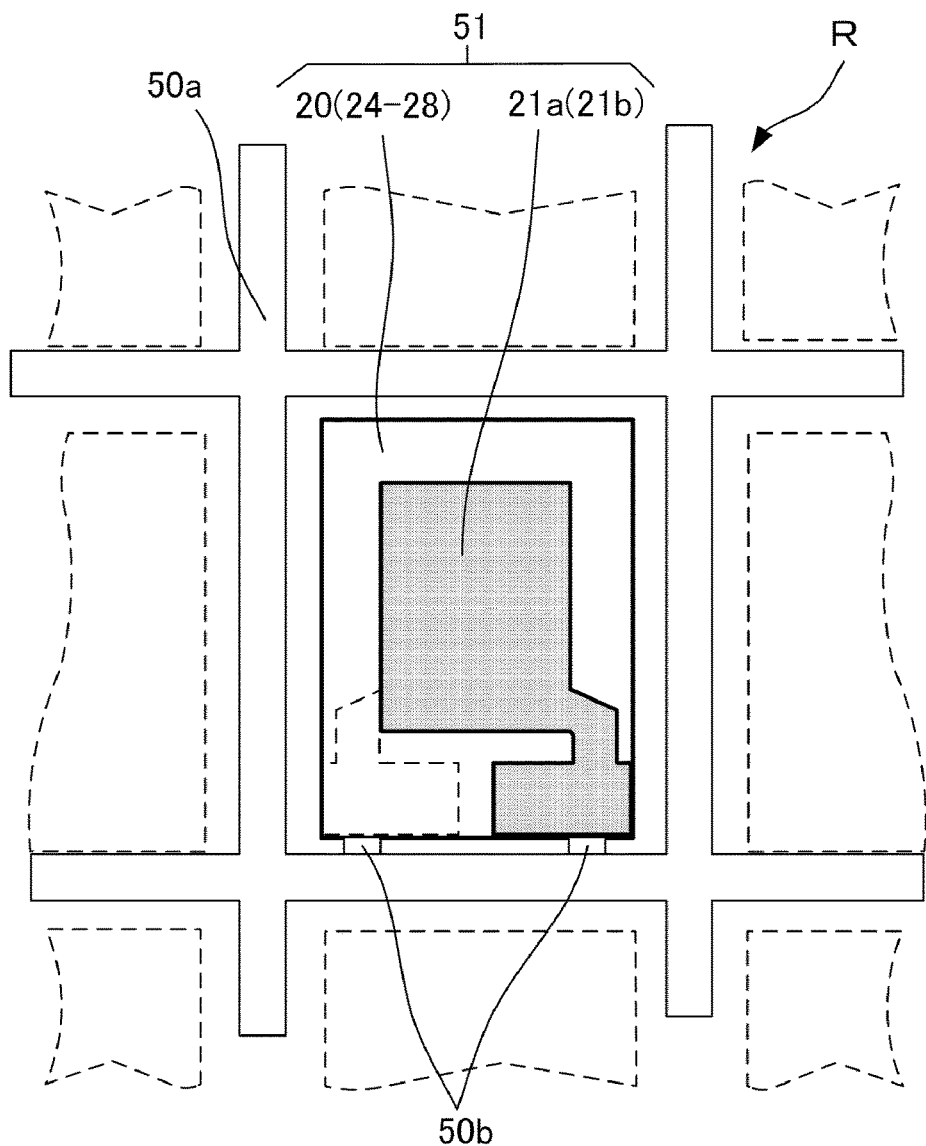

Next, an embodiment of a semimanufactured crystal unit used for manufacturing the above-described crystal unit will be described. FIG. 5A and FIG. 5B are explanatory drawings of a semimanufactured crystal unit 50 of the embodiment. Especially, FIG. 5A is a plan view of the whole semimanufactured crystal unit 50, and FIG. 5B is a plan view illustrating an enlarged part R in FIG. 5A.

The semimanufactured crystal unit 50 includes a wafer in which a plurality of quartz-crystal vibrating pieces 51 are arranged in a matrix. The quartz-crystal vibrating piece 51 includes the crystal element 20 (needless to say, may be the crystal elements 24 to 28, or the like) and the excitation electrodes 21a, 21b, and has the above-described ratio t/T or m/M in the above-described predetermined range. Here, the quartz-crystal vibrating pieces 51 are each connected to a crosspiece 50a included in the semimanufactured crystal unit 50 by bridges 50b. In the semimanufactured crystal unit 50, the quartz-crystal vibrating pieces 51 can be separated from the crosspiece 50a at positions of the bridges 50b and individualized. The individualized quartz-crystal vibrating pieces 51 are each mounted to the container 30 as illustrated in FIG. 1A and FIG. 1B, thereby allowing the manufacture of the desired crystal unit.

3. Experiment and Examination (Meanings of Ratios t/T and m/M, Sizes of Crystal Element and Excitation Electrode)

First, the meanings of the ratios t/T and m/M proposed in the present disclosure will be described using experimental results.

3-1. First Experiment on Ratio t/T

As the above-described crystal element 20, various types of crystal elements (specifically described below using FIG. 8A and FIG. 8B) having various long side dimensions and short side dimensions were prepared in a range of the long side dimension Lx (see FIG. 2A) of from 0.826 mm to 0.869 mm and in a range of the short side dimension Wx (see FIG. 2A) of from 0.587 mm to 0.635 mm. However, the excitation electrodes 21a, 21b formed on the front and back surfaces of these crystal elements 20 had the long side dimensions Le (see FIG. 2A) of 0.496 mm and the short side dimensions We (see FIG. 2A) of 0.25 mm. Moreover, in the formation of the excitation electrodes on the crystal element 20, the excitation electrodes were formed on the crystal elements so as to have three groups of a group in which the ratio t/T between the thickness t of the excitation electrodes and the thickness T of the crystal element was 0.0253, a group in which the ratio t/T was 0.0279, and a group in which the ratio t/T was 0.0294. The crystal units 10 having the structure described using FIG. 1A and FIG. 1B were produced using several types of crystal elements formed as described above.

The excitation electrode has a stacked structure including a chrome film as an underlying metal film and an Au film as a main metal film on the underlying metal film. Therefore, the thickness t of the excitation electrodes in this case is a total thickness of the Au films formed on the front and back surfaces of the crystal element 20. The oscillation frequency of the crystal unit 10 is 76.8 MHz. The crystal element used here is a crystal element in which the outer size of the container of the crystal unit is 1.2 mm×1.0 mm, that is, a crystal element having a size mountable to a container of 1210 size.

Next, these several types of crystal units are each oscillated while changing an electric power applied to the crystal unit from 10 μW→30 μW→100 μW→200 μW→300 μW. Then, a value obtained by subtracting an oscillation frequency f1 at the applied electric power of 10 μW from an oscillation frequency f3 at the applied electric power of 300 μW is divided by a nominal frequency F0 (76.8 MHz in this experiment) of this crystal unit, thus obtaining a frequency change rate $\Delta F$ (unit: ppm)=(f3−f1)/F0.

Figure 6A:
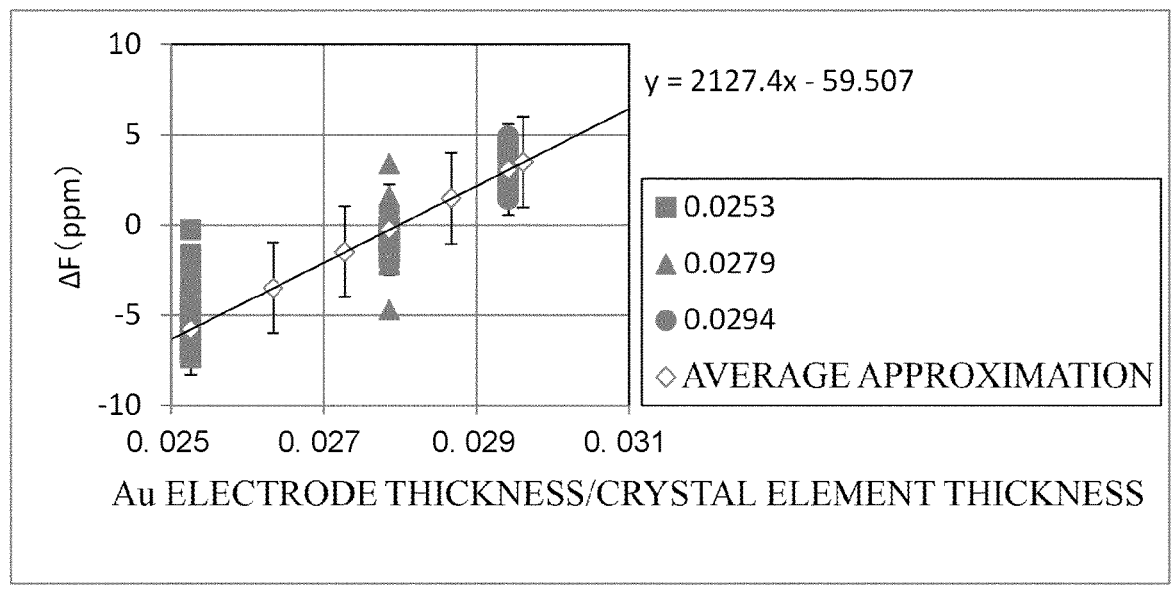
FIG. 6A and FIG. 6B are drawings for describing a relation between Au electrode thickness/crystal element thickness and a frequency change rate in DLD characteristics, FIG. 6A relates to the crystal element 20 in the first embodiment, and FIG. 6B relates to the crystal element 24 in the second embodiment.

Relations between the frequency change rate $\Delta F$ and the ratio t/T of the respective crystal units at the above-described levels are plotted. FIG. 6A is the plot in which the horizontal axis has the Au electrode thickness/crystal element thickness (that is, t/T) and the vertical axis has the frequency change rate $\Delta F$, thus illustrating the relation between them. In FIG. 6A, black squares ■ indicate the group of the ratio t/T of 0.0253, black triangles ▲ indicate the group of the ratio t/T of 0.0279, and black circles ● indicate the group of the ratio t/T of 0.0294. Moreover, FIG. 6A illustrates an approximated curve based on data of the above-described three groups approximated by a least squares approximation.

Here, a crystal unit having the frequency change rate $\Delta F$ of ±6 ppm is industrially applicable, and a crystal unit having the frequency change rate $\Delta F$ of ±4 ppm is further industrially applicable. Therefore, by calculating the ratio t/T satisfying the frequency change rate $\Delta F$ of ±6 ppm from the obtained approximated curve, it was found that the ratio t/T was from 0.026 to 0.030. By calculating the ratio t/T satisfying the frequency change rate $\Delta F$ of ±4 ppm from the approximated curve, it was found that the ratio t/T was from 0.027 to 0.029. Accordingly, the ratio t/T is preferably from 0.026 to 0.030, and the ratio t/T is more preferably from 0.027 to 0.029.

As an additional experiment to the first experiment, an experiment in which the thickness of the Au electrode was thinned compared with the first experiment was conducted. Specifically, crystal units were experimentally produced at respective levels of the cases where the Au electrode thickness/crystal element thickness was 0.0092, 0.0153, and 0.0206, and the drive level characteristics were measured for these crystal units similarly to the first experiment. The reason for setting the Au electrode thickness/crystal element thickness to 0.0092, 0.0153, and 0.0206 is as follows. For the crystal unit having the oscillation frequency in the frequency band lower than about 76 MHz, specifically, the frequency band in the approximately 38 MHz band, the design with the Au electrode thickness/crystal element thickness of 0.0092, 0.0153, 0.0206, and the like is often used. Therefore, by confirming the DLD characteristics in the electrode design in the low frequency band, the meaning of the present disclosure is confirmed.

Figure 13A:
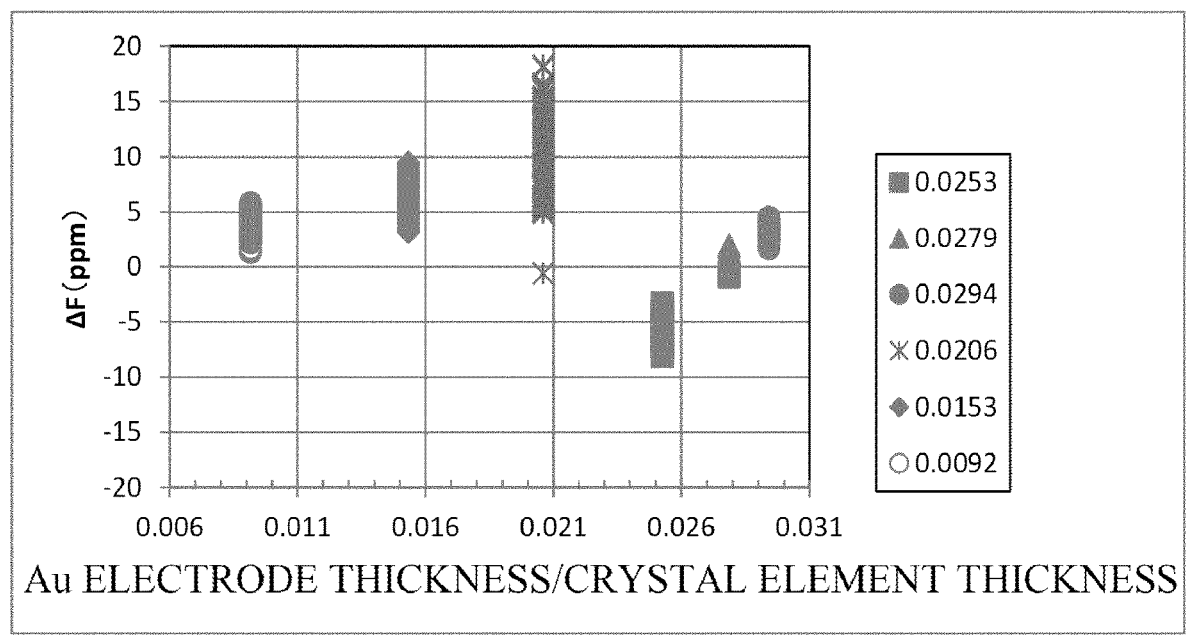
FIG. 13A is a drawing for describing a result of a complementary experiment of the experiment described using FIG. 6A.

FIG. 13A is a characteristic diagram illustrating DLD characteristics data in the additional experiment together with the DLD characteristics data of the result of the first experiment illustrated in FIG. 6A. The horizontal axis has the Au electrode thickness/crystal element thickness, and the vertical axis has the above-described frequency change rate.

Figure 13B:
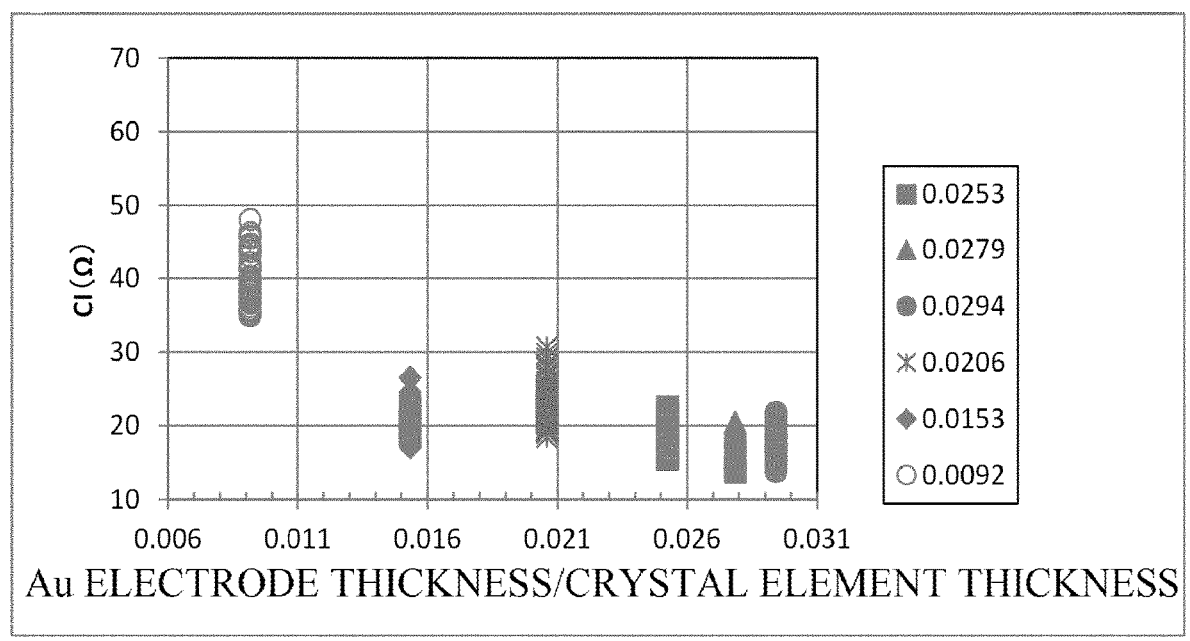
FIG. 13B is a drawing for describing a distribution of a crystal impedance of the crystal unit described in FIG. 13A.

From FIG. 13A, it is seen that, when the Au electrode thickness is thin compared with the case of the first experiment with the Au electrode thickness/crystal element thickness of about 0.0092, 0.0153, and 0.0206, the frequency change rate is varied in a positive side region, that is, a region of from 0 ppm to 20 ppm. Moreover, it is seen that the frequency change rate increases as the Au electrode thickness/crystal element thickness increases from 0.0092 to 0.0153, and to 0.0206. For the first experiment and the additional experiment, a crystal impedance (CI) as one of the important characteristics of the crystal unit was also examined. FIG. 13B is a characteristic diagram summarizing the examination results, and a drawing illustrating a relation between the Au electrode thickness/crystal element thickness and the crystal impedance CI. The horizontal axis has the Au electrode thickness/crystal element thickness, and the vertical axis has the crystal impedance CI.

From FIG. 13B, it is seen that the crystal impedances CI of the crystal units having the Au electrode thickness/crystal element thickness at the respective levels of 0.0092, 0.0153, and 0.0206 are distributed in a region of from 20Ω to 50Ω, and moreover, the crystal impedance CI of the crystal unit at the level of 0.0092 is the poorest in the Au electrode thickness/crystal element thickness of 0.0092, 0.0153, and 0.0206. In contrast, it is seen that the crystal impedances CI of the crystal units at the respective levels of the Au electrode thickness/crystal element thickness of 0.1840, 0.2030, and 0.2143 including the range of the present disclosure are 20 and a few Ω or less, and especially, those in the range of the present disclosure are approximately 20Ω or less.

Also from each of the result of the additional experiment and the evaluation result of the crystal impedance CI, it is seen that the ratio t/T is preferably from 0.026 to 0.030, and the ratio t/T is more preferably from 0.027 to 0.029.

3-2. Second Experiment on Ratio t/T

Figure 6B:
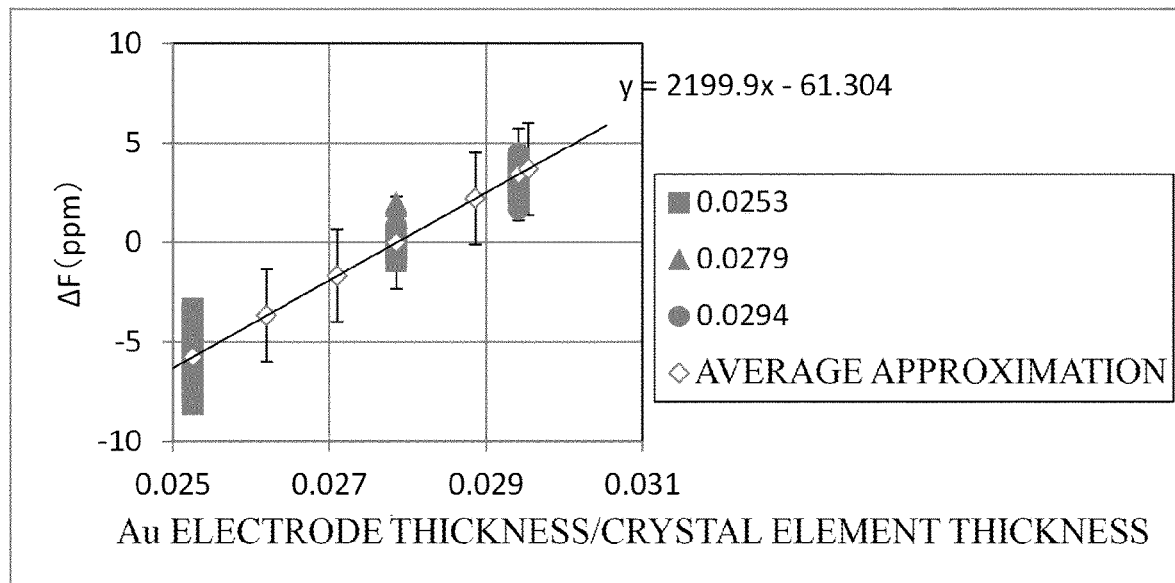

While the crystal element 20 of the first embodiment was used as a crystal element in the first experiment, the crystal element 24 of the second embodiment was used in the second experiment. Except this, the crystal units at a plurality of levels were produced similarly to the first experiment, the frequency change rates ΔF of these crystal units were each obtained, and the relation between the frequency change rates ΔF and the ratio t/T was plotted. FIG. 6B is a plot of the relation.

Then, an approximation formula was obtained similarly to the first experiment, a relation between the frequency change rate ΔF and the ratio t/T was obtained, and further, the ratio t/T satisfying the frequency change rate ΔF of ±6 ppm and the ratio t/T satisfying the frequency change rate ΔF of ±4 ppm were each obtained.

Consequently, it was found that, also in the case of using the crystal element 24, the ratio t/T satisfying the frequency change rate ΔF of ±6 ppm was from 0.026 to 0.030, and the ratio t/T satisfying the frequency change rate ΔF of ±4 ppm was from 0.027 to 0.029.

From the result of the first experiment and the result of the second experiment, it can be said that the preferable range of the ratio t/T does not change regardless of the change of the structure of the side surface intersecting with the Z'-axis of the crystal element.

Similarly to the additional experiment to the first experiment, crystal units were experimentally produced at respective levels of the cases where the Au electrode thickness/crystal element thickness was 0.0092, 0.0153, and 0.0206 using the crystal element 24, and the drive level characteristics were measured for these crystal units. The crystal impedances (CI) were also evaluated. Consequently, also in the case of using the crystal element 24, the results similar to those described using FIG. 13A and FIG. 13B were obtained. That is, it was found that the results similar to those described using FIG. 13A and FIG. 13B were obtained regardless of the change of the structure of the side surface intersecting with the Z'-axis of the crystal element.

3-3. Third Experiment (Examination from Ratio m/M as Other Aspect)

While the ratio t/T was examined in the first and the second experiments, a satisfactory range of the drive level characteristics was examined with a mass of the excitation electrode to the mass of the crystal element as a parameter, and the following results were obtained. Specifically, for the crystal unit produced in the first experiment and the crystal unit produced in the second experiment, when a mass of the crystal in a region of the crystal element in which the excitation electrodes were disposed was expressed as M, and a mass of the excitation electrodes on the front and back surfaces in the region was expressed as m, a relation between a ratio m/M and the frequency change rate ΔF was examined. In this case, the mass m of the excitation electrodes is a mass of the Au electrodes.

Figure 7A:
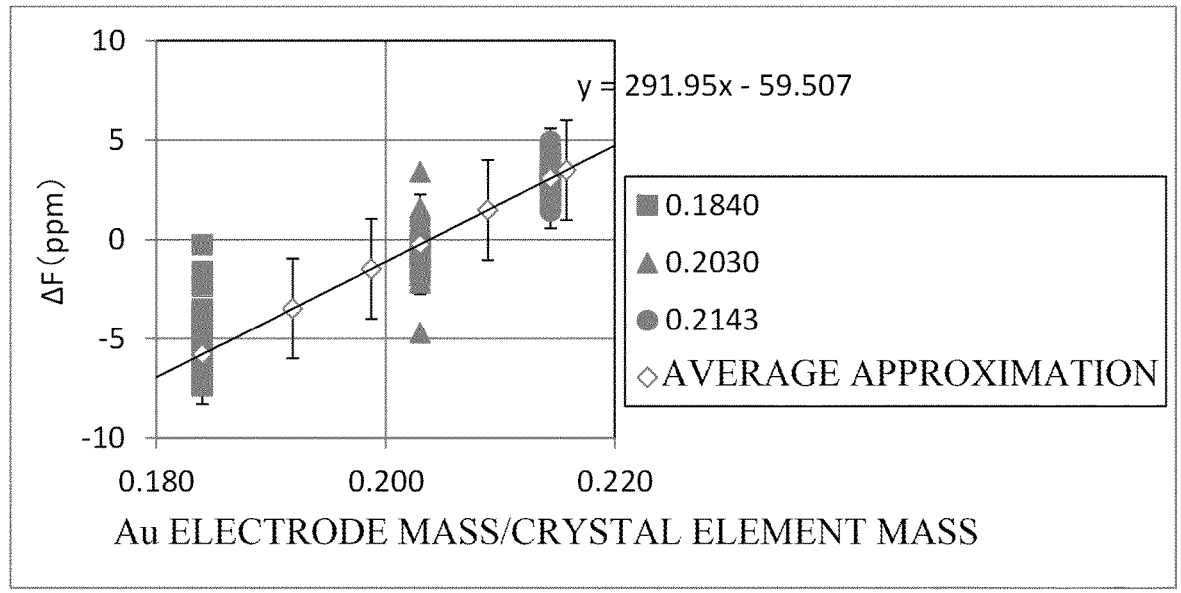
FIG. 7A and FIG. 7B are drawings for describing a relation between Au electrode mass/crystal element mass and the frequency change rate in the DLD characteristics, FIG. 7A relates to the crystal element 20 in the first embodiment, and FIG. 7B relates to the crystal element 24 in the second embodiment.
Figure 7B:
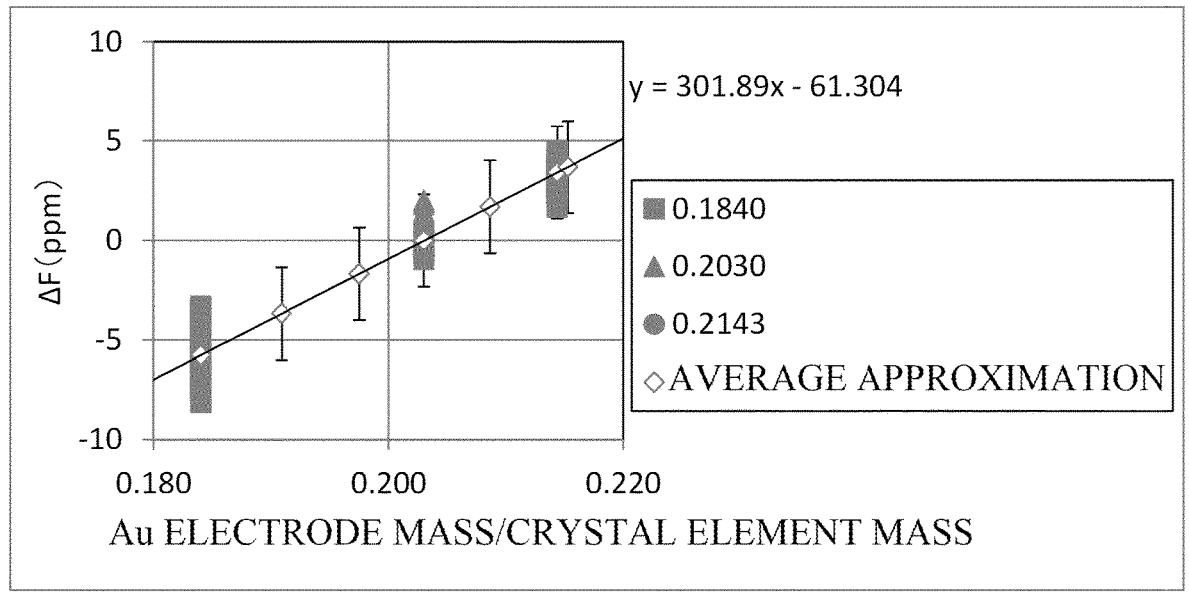

FIG. 7A is a plot illustrating a relation between the frequency change rate ΔF and the ratio m/M in the case of using the crystal element 20, and FIG. 7B is a plot illustrating a relation between the frequency change rate ΔF and the ratio m/M in the case of using the crystal element 24.

Based on the plots, respective approximation formulas between the ratio m/M and the frequency change rate ΔF were obtained, and the ratio m/M satisfying the frequency change rate ΔF of ±6 ppm and the ratio m/M satisfying the frequency change rate ΔF of ±4 ppm were obtained for each of the plots.

Consequently, it was found that, in both cases of using the crystal element 20 and using the crystal element 24, the ratio m/M satisfying the frequency change rate ΔF of ±6 ppm was from 0.192 to 0.216, and the ratio m/M satisfying the frequency change rate ΔF of ±4 ppm was from 0.199 to 0.209.

Figure 14A:
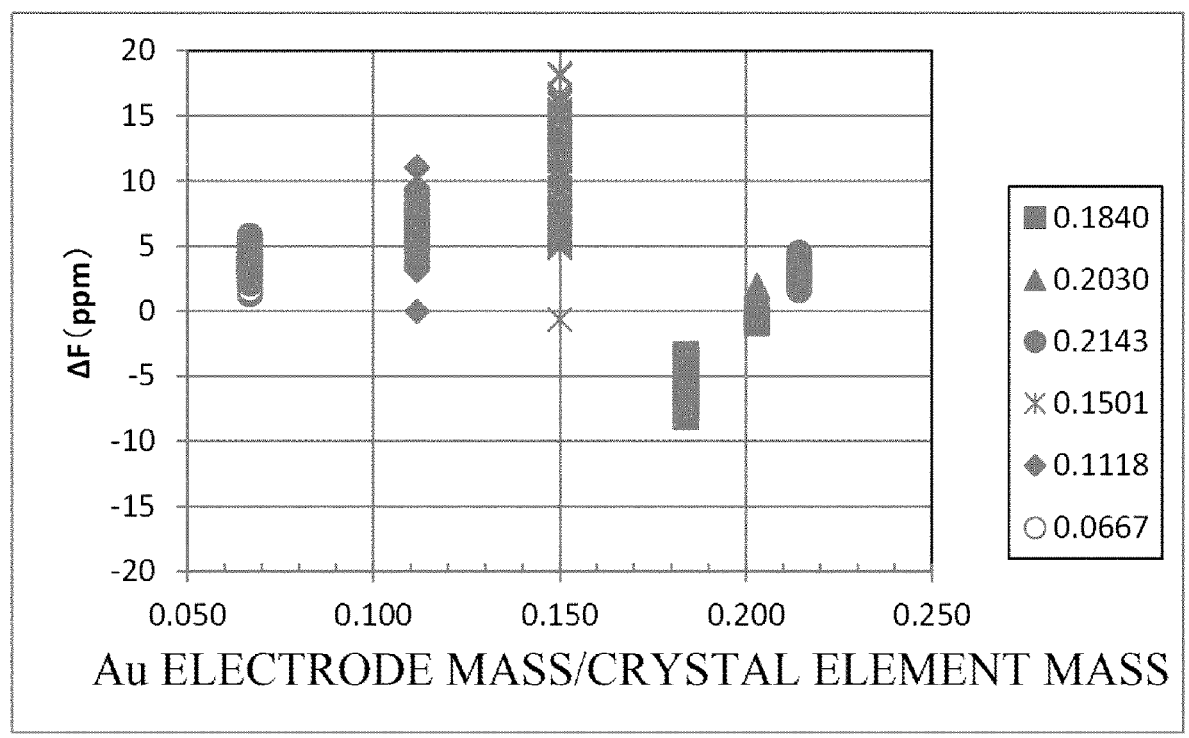
FIG. 14A is a drawing for describing a result of a complementary experiment of the experiment described using FIG. 7A.
Figure 14B:
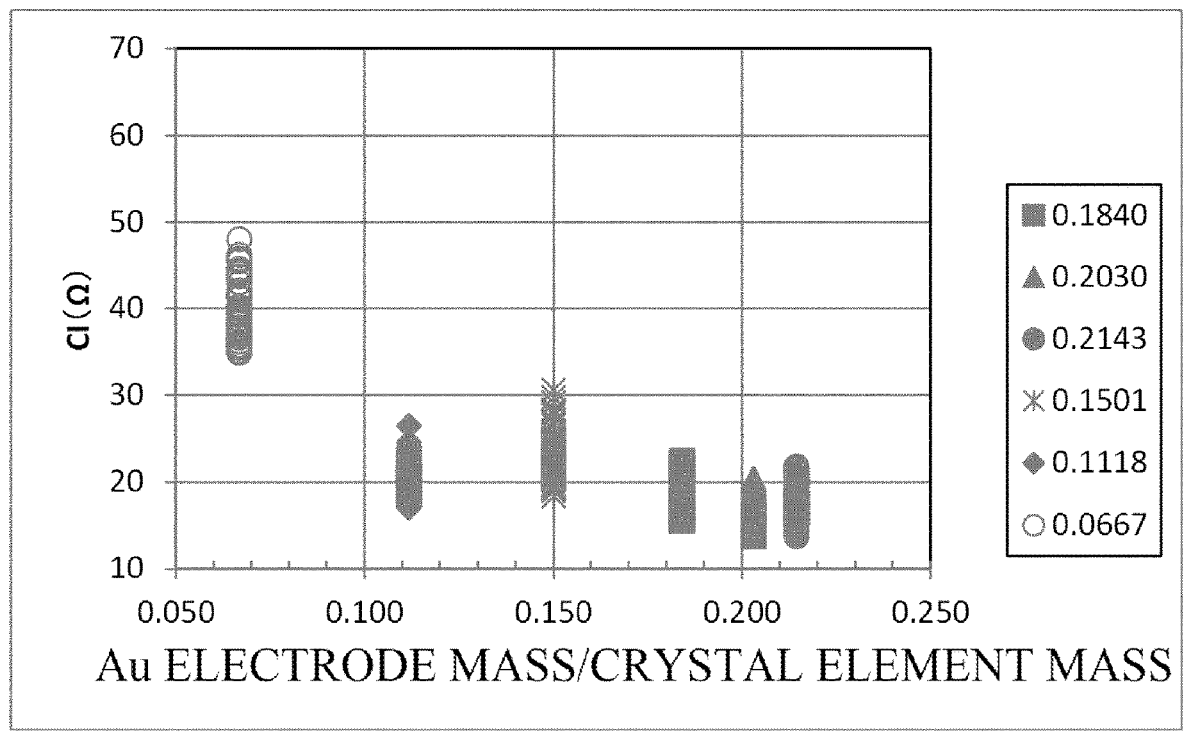
FIG. 14B is a drawing for describing a distribution of a crystal impedance of the crystal unit described in FIG. 14A.

Also for the results of the additional experiments using the respective crystal element 20 and crystal element 24, the relation between the ratio m/M and the frequency change rate ΔF and the relation between the ratio m/M and the crystal impedance CI were each examined with the ratio m/M instead of the ratio t/T. That is, for the ratio m/M at the small levels of 0.00667, 0.1118, and 0.1501, the DLD characteristics and the crystal impedance CI were examined. FIG. 14A and FIG. 14B illustrate the summaries of the examination results similarly to FIG. 13A and FIG. 13B.

From FIG. 14A and FIG. 14B, it is seen that the crystal impedance CI increases with the ratio m/M at the small levels of 0.00667, 0.1118, and 0.1501.

Accordingly, it is seen that, in the cases of using the crystal element 20 and using the crystal element 24, also when focusing on the ratio m/M, the ratio m/M satisfying the frequency change rate ΔF of ±6 ppm is from 0.192 to 0.216, and the ratio m/M satisfying the frequency change rate ΔF of ±4 ppm is from 0.199 to 0.209.

3-4. Examination of Size Dependency of Crystal Element

Figure 8A:
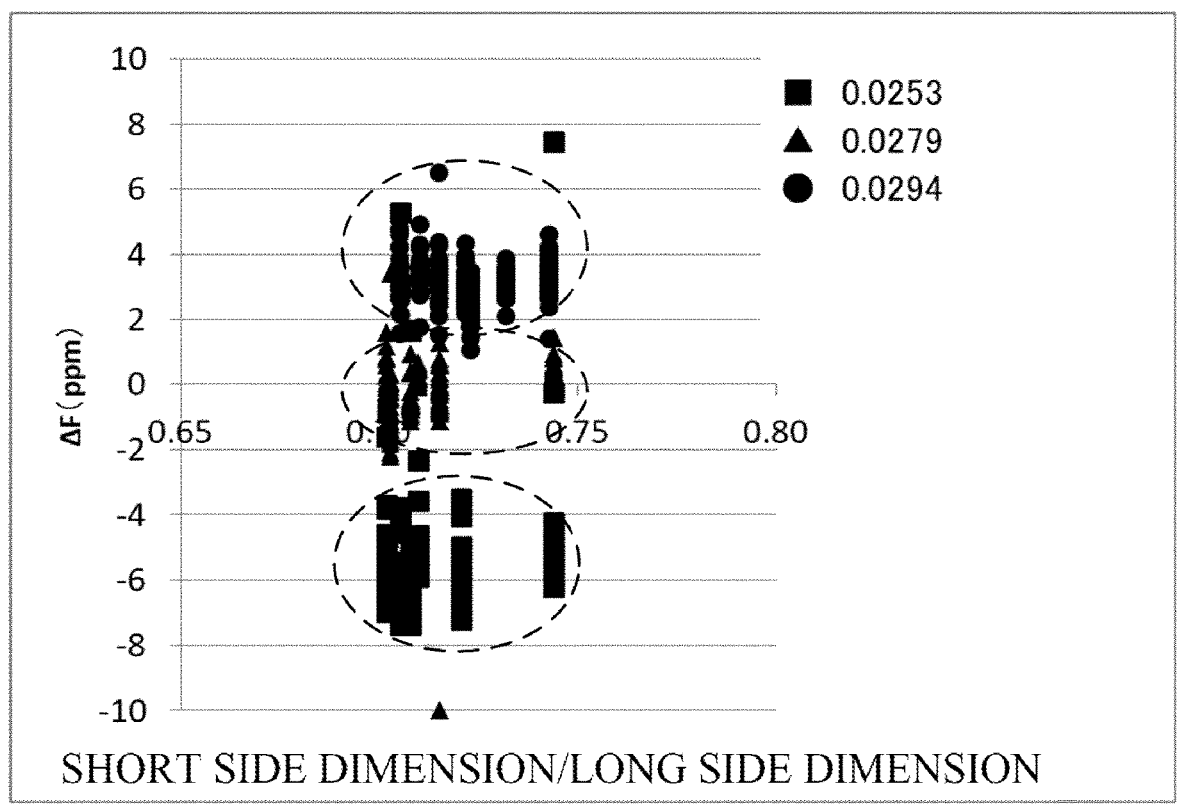
FIG. 8A and FIG. 8B are drawings for describing that an effect of the disclosure is independent of a side ratio of the crystal element, FIG. 8A relates to the crystal element 20 in the first embodiment, and FIG. 8B relates to the crystal element 24 in the second embodiment.
Figure 8B:
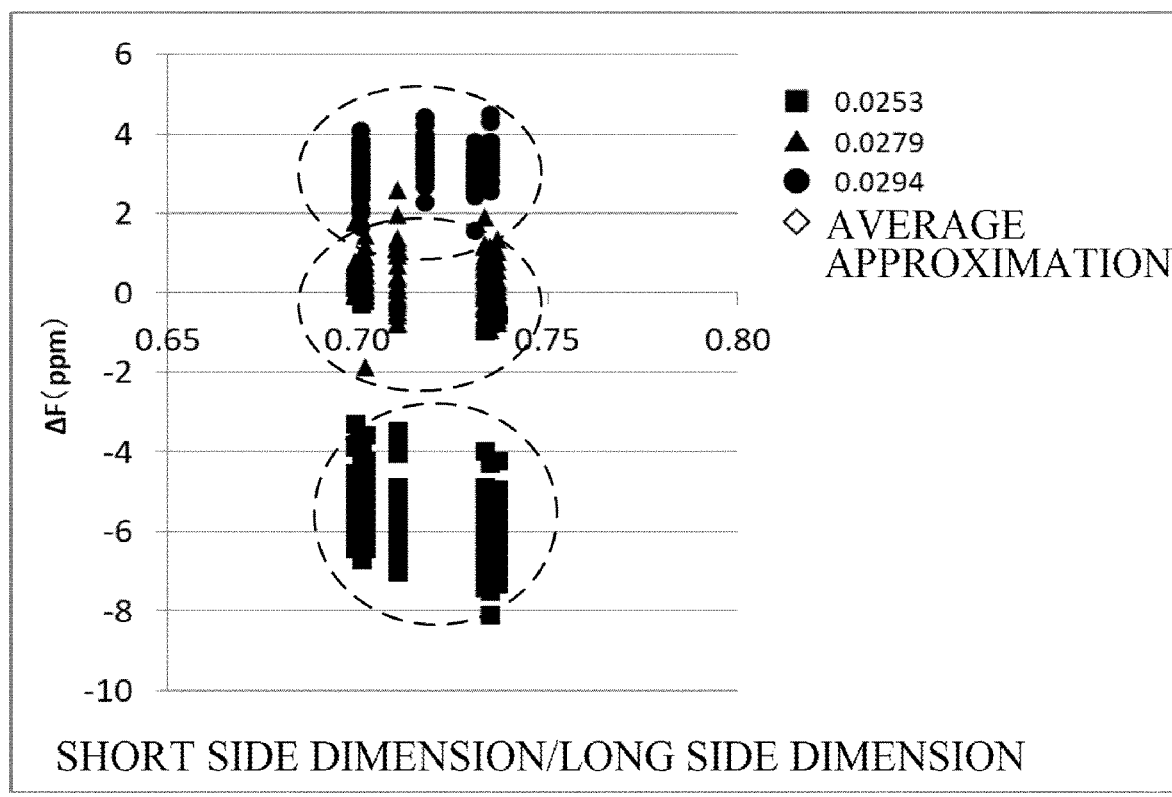

It was examined whether the effects of the ratio t/T and the ratio m/M proposed in the disclosure disappear due to the change of the size of the crystal element or not. FIG. 8A and FIG. 8B are explanatory drawing for it. In FIG. 8A and FIG. 8B, the horizontal axis has a ratio between the short side dimension and the long side dimension of the crystal element, that is, a side ratio, and the vertical axis has the frequency change rate ΔF. Specifically, FIG. 8A is a plot illustrating the relations between short side dimension/long side dimension of the various crystal elements used in the first experiment and the frequency change rate ΔF, and FIG. 8B is a plot illustrating the relations between short side dimension/long side dimension of the various crystal elements used in the second experiment and the frequency change rate ΔF.

From FIG. 8A and FIG. 8B, it is seen that there is no correlation between the short side dimension/long side dimension of the crystal element and the frequency change rate ΔF. In fact, since the frequency change rate ΔF of the crystal unit group having the ratio t/T of 0.0279 is distributed in a range of ±2 ppm, it can be understood also from FIG. 8A and FIG. 8B that the ratio t/T in the range determined to be preferable in the examinations of the first experiment and the second experiment allows decreasing the frequency change rate ΔF.

3-5. Examination of Size Dependency of Excitation Electrode

Figure 9:
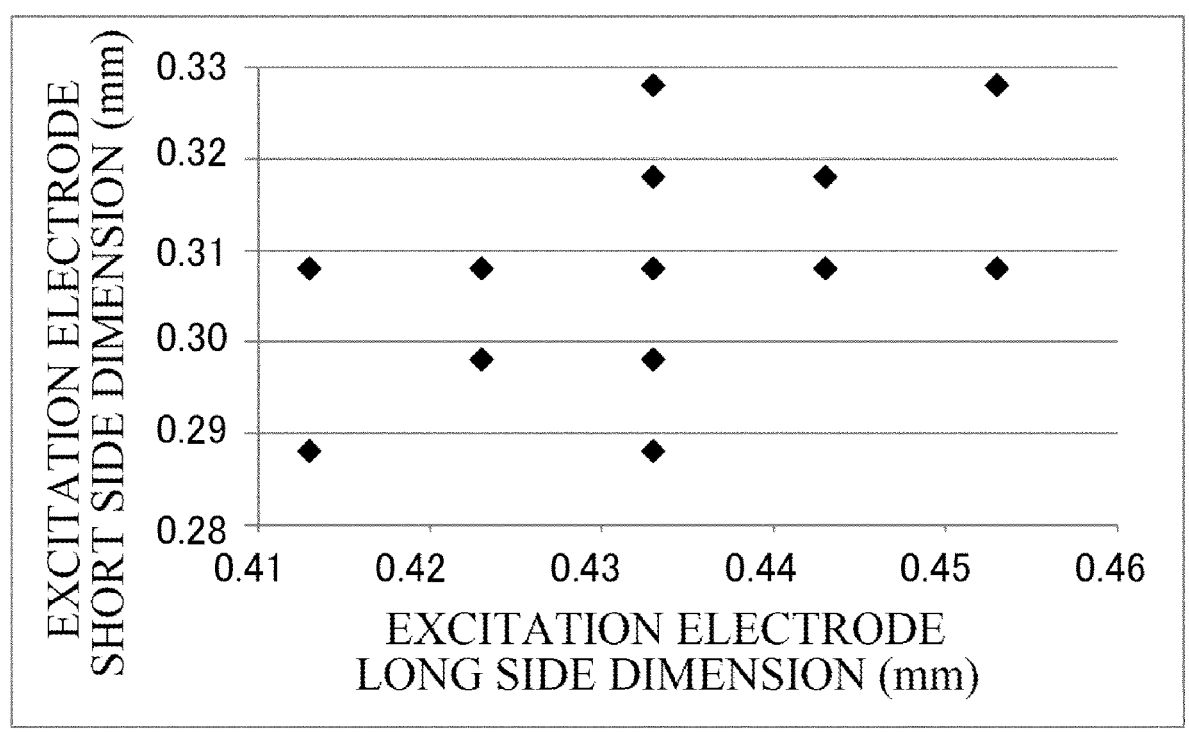
FIG. 9 is a drawing for describing conditions (levels) of samples in an experiment in which a size of an excitation electrode is variously changed.

An experiment and an examination whether the effects of the ratio t/T and the ratio m/M proposed in the disclosure disappear due to the change of the size of the excitation electrode or not were conducted as follows. However, in this experiment, a crystal element having a long side dimension of 0.745 mm and a short side dimension of 0.514 mm was used. Moreover, for excitation electrodes disposed on front and back surfaces of the crystal element, the long side dimension and the short side dimension were each changed at a plurality of levels around the long side dimension of 0.434 mm and the short side dimension of 0.308 mm as the center as indicated by 13 points in FIG. 9. Moreover, the excitation electrodes were prepared so as to have three types of the ratio t/T of 0.0279 in the range of the disclosure (referred to as Example), the ratio t/T of 0.0199 out of the range of the disclosure (referred to as Comparative Example 1), and the ratio t/T of 0.0167 out of the range of the disclosure (referred to as Comparative Example 2). Then, crystal units for the experiment at the plurality of levels were produced using the crystal elements. The crystal element used here is a crystal element in which the outer size of the container of the crystal unit is 1 mm×0.8 mm, that is, a crystal element mountable to a container of 1008 size.

Next, for each of the experimentally produced crystal units, the drive level characteristics, that is, characteristics for the frequency change rate ΔF were obtained with the procedure similar to that of the first experiment. Then, the relation between the frequency change rate ΔF and the excitation electrode size was plotted.

Figure 10A:
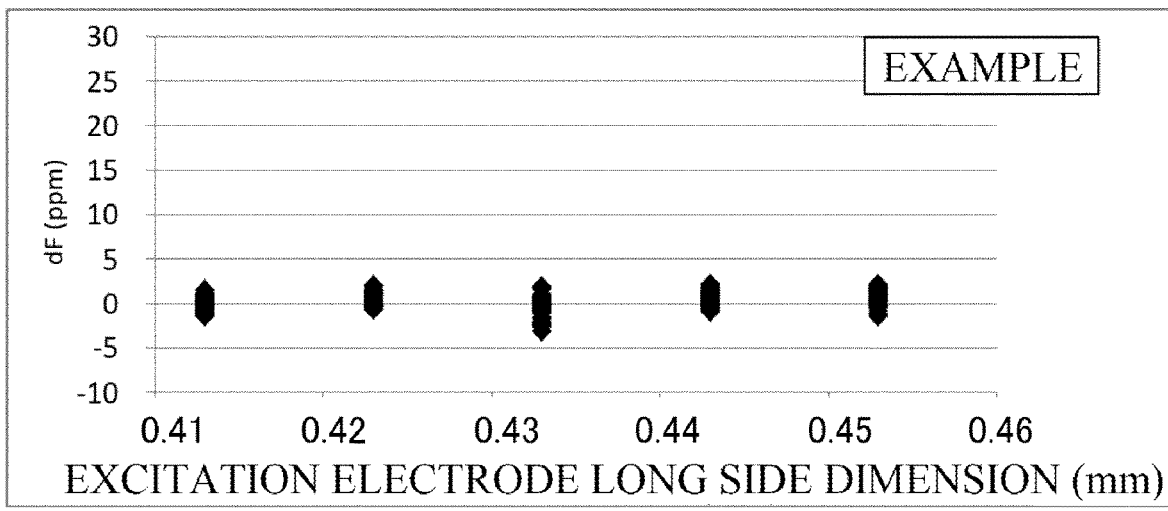
FIG. 10A to FIG. 10C are drawings for describing that the effect of the disclosure is independent of the size of the excitation electrode, and drawings summarized for a long side of the excitation electrode.
Figure 10B:
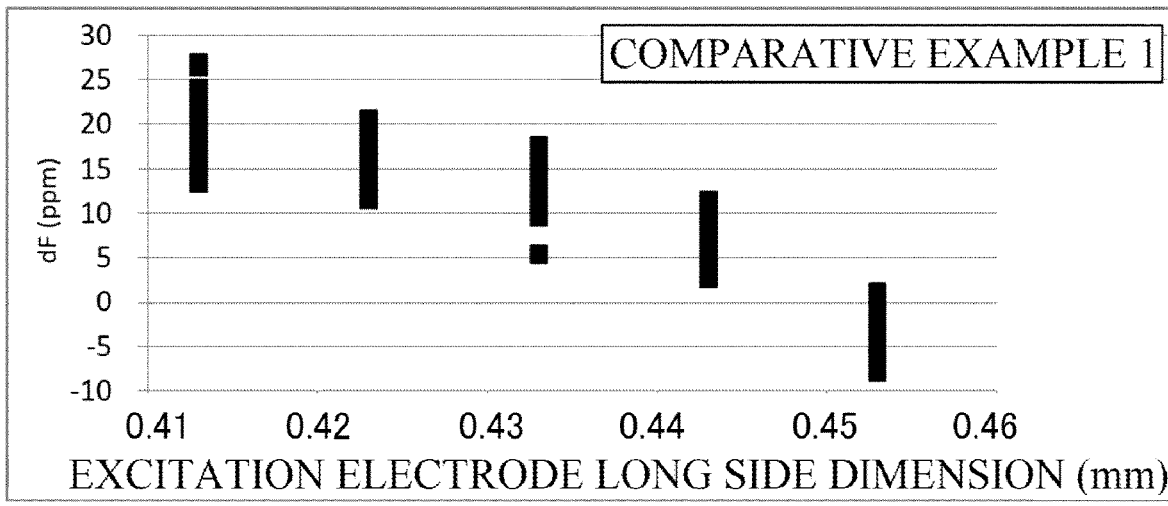
Figure 10C:
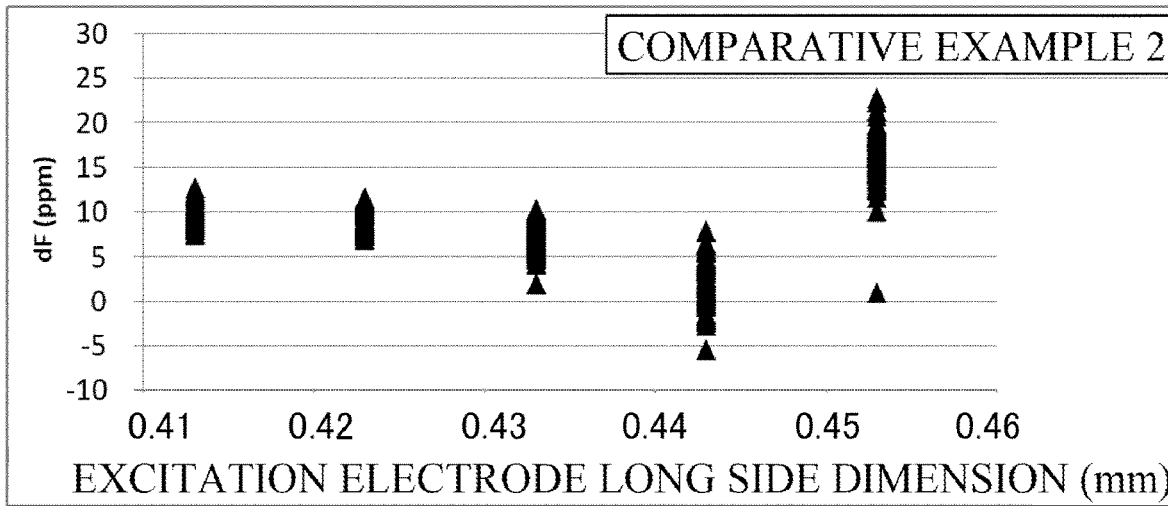
Figure 11A:
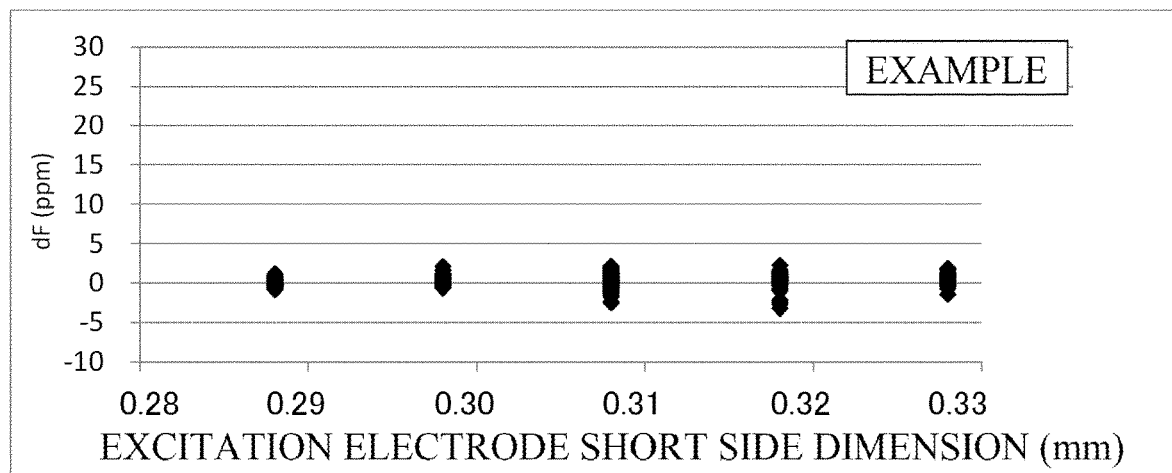
FIG. 11A to FIG. 11C are drawings for describing that the effect of the disclosure is independent of the size of the excitation electrode subsequent to FIG. 10A to FIG. 10C, and drawings summarized for a short side of the excitation electrode.
Figure 11B:
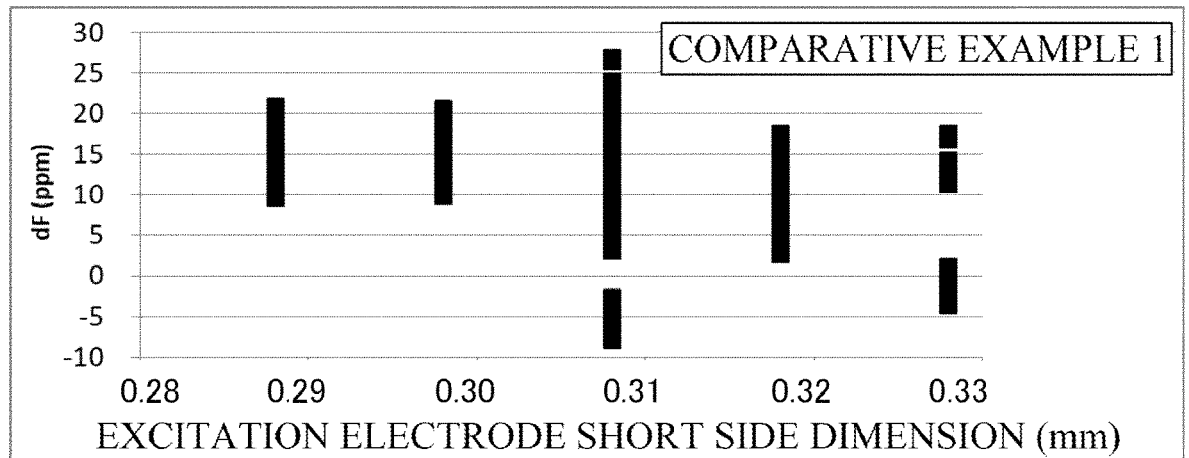
Figure 11C:
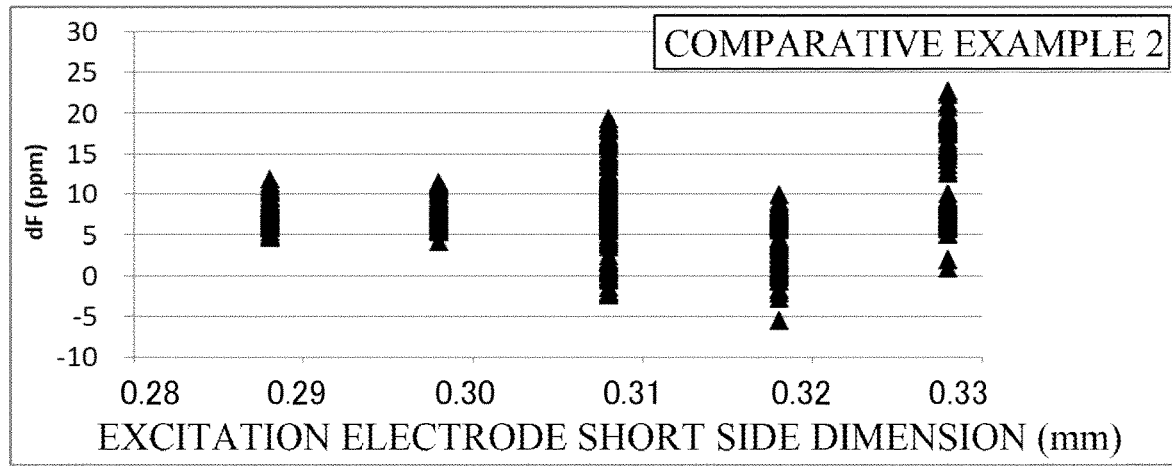

FIG. 10A to FIG. 11C are thus plotted characteristic diagrams. Specifically, FIG. 10A to FIG. 10C are drawings illustrating the plot of the relation between the long side dimension of the excitation electrode and the frequency change rate ΔF, and FIG. 11A to FIG. 11C are drawings illustrating the plot of the relation between the short side dimension of the excitation electrode and the frequency change rate ΔF. From each of FIG. 10A to FIG. 11C, it is seen that in Example in which the ratio t/T is in the range of the present disclosure (see FIG. 10A, FIG. 11A), the frequency change rate ΔF is approximately constant in the preferable range and does not change even when the long side dimension and the short side dimension of the excitation electrode are changed. In contrast, it is seen that in both Comparative Example 1 and Comparative Example 2, the frequency change rate ΔF changes when the long side dimension and the short side dimension of the excitation electrode are changed. Moreover, it is also seen that in both Comparative Example 1 and Comparative Example 2, the frequency change rate ΔF is deviated from the range of ±6 ppm and ±4 ppm.

Therefore, it is seen that the ratio t/T and the ratio m/M in the ranges proposed in the present disclosure allows keeping a state where the change of the frequency change rate ΔF is small even when the size of excitation electrode is changed. That is, the present disclosure is preferable because the size dependency of the excitation electrode is small.

4. Method for Manufacturing Crystal Unit

From the above-described explanation, as a preferable method for manufacturing a crystal unit that vibrates in a thickness-shear mode and is excellent in DLD characteristics, the following method is included. That is, when a thickness of a crystal element is expressed as T, and a total thickness of excitation electrodes disposed on front and back surfaces of the crystal element is expressed as t, a crystal unit is manufactured by a method including the following processes while focusing on the t and T. The following describes its embodiment with reference to a flowchart illustrated in FIG. 12.

Figure 12:
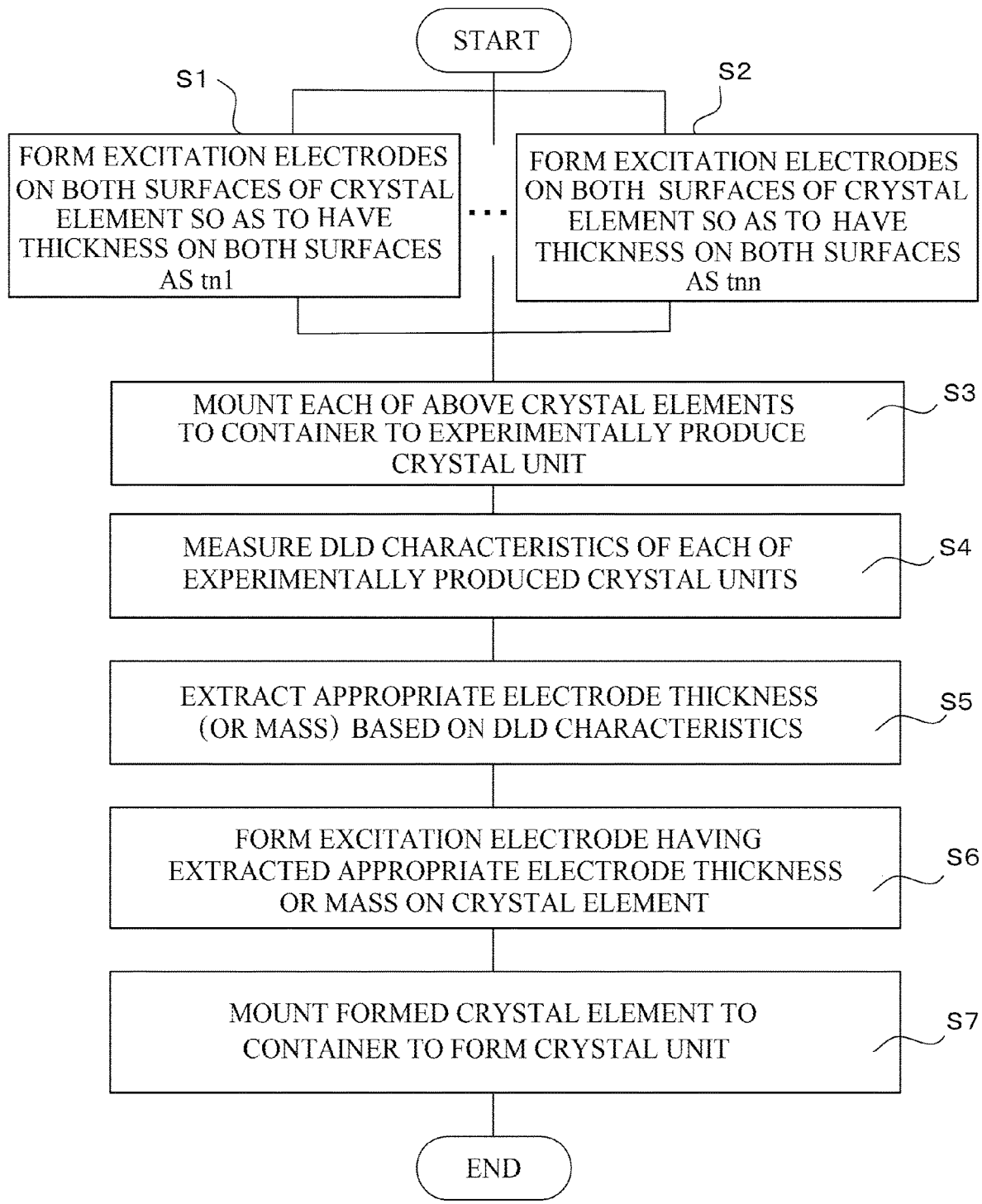
FIG. 12 is a flowchart describing a main part of the disclosure of a method for manufacturing the crystal unit.

A plurality of crystal elements that vibrate in a thickness-shear mode and have thicknesses T are prepared, and excitation electrodes are formed on both surfaces of the crystal elements so as to each have a thickness tn1 as a total thickness of the excitation electrodes on both surfaces (Step S1 in FIG. 12). Excitation electrodes are formed on both surfaces of crystal elements each having a thickness similar to that of a first crystal element so as to each have a thickness tn2(≠tn1) as a total thickness of the excitation electrodes on both surfaces. Similarly, excitation electrodes are formed on both surfaces of crystal elements in an n-th group having thicknesses similar to the thickness of the first crystal element so as to each have a thickness tnn (≠tn1, tn2) as a total thickness of the excitation electrodes on both surfaces (Step S2 in FIG. 12).

Then, the crystal elements of the n types of groups on which the excitation electrodes have been formed are mounted to containers, thus forming crystal units with the structures illustrated in FIG. 1A and FIG. 1B (Step S3 in FIG. 12). Next, the drive level characteristics of the respective crystal units are measured (Step S4 in FIG. 12).

Next, for example, the frequency change rate ΔF (frequency difference between applied electric powers of 10 μW and 300 μW) is obtained for each crystal unit from the measured drive level. Subsequently, the relation between the frequency change rate ΔF and the ratio t/T is plotted for each crystal unit, and the ratio t/T at which the frequency change rate ΔF is in a predetermined range, for example, ±6 ppm as described above, is extracted, thus extracting the appropriate thickness t of the excitation electrode (Step S5 in FIG. 12). The mass m convertible from the thickness t may be extracted. The mass can be obtained from the thickness of the excitation electrode and a density of the material constituting the excitation electrode.

Next, the excitation electrodes are formed on the crystal element so as to have the extracted thickness t as the thickness of the excitation electrode (Step S6 in FIG. 12), and subsequently, the crystal element is mounted to a container, thus obtaining an intended crystal unit (Step S7 in FIG. 12).

Since the crystal unit manufactured as described above has the ratio t/T (m/M) in the appropriate range proposed in the present disclosure, the crystal unit excellent in DLD characteristics can be obtained.

5. Modification

While the preferred embodiment of the present disclosure has been described above, the effect of the present disclosure similar to that in the embodiment can be expected in the following modifications as well.

While the embodiment uses an example of an AT-cut crystal element having long sides parallel to the X-axis of the crystal and short sides parallel to the Z'-axis of the crystal, the effect of the present disclosure can be provided by an AT-cut crystal element having long sides parallel to the Z'-axis of the crystal and short sides parallel to the X-axis of the crystal.

While an AT-cut crystal element is used as a crystal element that vibrates in a thickness-shear mode, the effect of the present disclosure can be expected with another crystal element that vibrates in the thickness-shear mode, for example, a twice rotated crystal element typified by an SC-cut.

While the example in which the shape of the crystal element and the shape of the excitation electrode are rectangular shapes in plan view is described, the similar effect can be expected with any shapes of the crystal element or the excitation electrode including a square shape, a circular shape, an elliptical shape, and the like.

The constituent material of the excitation electrode is not limited to chrome or gold, and may be any other appropriate material. The excitation electrodes disposed on the front and back surfaces of the crystal element does not need to be opposed to one another.

While the example of using a ceramic container with a depressed portion as a container is described, the container structure is not limited to the example. For example, a container structure in which a crystal element is mounted to a ceramic substrate in a flat plate shape, and the crystal element is sealed with a cap-shaped lid member, and a metallic lead-type container structure may be employed.

While the example of the crystal unit having the oscillation frequency of 76 MHz to 80 MHz is described, the present disclosure is applicable to a crystal unit having other frequency bands.

With the ratio t/T in the range of from 0.026 to 0.030, as described above, an amount of frequency variation (that is, DLD characteristics) of the crystal unit when a drive level applied to the crystal unit is changed in a predetermined range can be suppressed to a range of ±6 ppm. The crystal unit having the DLD characteristics suppressed to this range is preferable because specifications required by a user of the crystal unit are satisfied and the industrial applicability is improved.

To embody the disclosure of the crystal unit, more preferably, the ratio t/T is from 0.027 to 0.029. In the preferred range, as described above, the amount of frequency variation in the DLD characteristics can be suppressed to a range of ±4 ppm. The crystal unit having the DLD characteristics suppressed to this range is further preferable because the industrial applicability is more improved.

Here, the thickness T of the crystal element is an actually measured thickness, a thickness calculated by a well-known calculation formula from an actual frequency and a frequency constant (for example, 1670 when the crystal element is an AT-cut crystal element), or the like, and can be extracted by any method.

Meanwhile, the thickness t of the excitation electrode in the disclosure is a thickness of a film of a main metal constituting the excitation electrode, and a thickness when the main metal is gold (Au). The following describes this respect.

An excitation electrode of a crystal unit generally has a stacked structure of an underlying metal film for ensuring adhesion between a crystal element and the excitation electrode and a film of a main metal formed on the underlying metal film. Then, since the thickness of the underlying metal film is considerably thin compared with the thickness of the main metal film, it is difficult to measure the thickness in some cases. Additionally, since the thickness of the underlying metal film is considerably thin, the gist of the present disclosure can be achieved even when the thickness of the underlying metal film is excluded. Therefore, the thickness t of the excitation electrode in the disclosure can be assumed as the thickness of the film of the main metal in the excitation electrode. Accordingly, when the underlying metal is chrome (Cr), and the main metal is gold (Au), the main metal is gold. When the underlying metal is chrome (Cr), and the main metal is silver (Ag), the main metal is silver. The number of stacked layers of the excitation electrode may be three or more, and in the case, it is only necessary to take the main metal into consideration. The main metal may be an alloy layer. When the thickness of the underlying metal film is measurable, it may be taken into consideration.

The thickness t of the excitation electrode is a thickness when the main metal is gold, and this is mainly because gold is often used as the main metal of the excitation electrode. Therefore, when the main metal is a metal other than gold, and a thickness of an electrode containing the metal other than gold is tx, the thickness t of the electrode in the present disclosure is a thickness converted by $t = tx \cdot Wx/Wo$. Here, Wx is a density of electrode materials other than gold, and Wo is a density of gold. In a specific example, for example, when an excitation electrode has a thickness tx in a case where the main metal of the excitation electrode is silver (Ag), the thickness t of the electrode in the present disclosure is a thickness obtained by $t = tx *$ (silver density/gold density). Accordingly, when the main metal of the excitation electrode is silver (Ag), since the silver density is 10.50, and the gold density is 19.32 ("Chronological Scientific Tables 2016," published Nov. 30, 2015, page 385), the thickness t of the excitation electrode in the present disclosure is a thickness obtained by $t = tx \cdot (10.5/19.32) \approx 00.543 \cdot tx$. Also in a case where the main metal film is a laminated film or an alloy film, the thickness t is simply obtained from the density of the film and the gold density by the above-described formula.

When a thickness of the excitation electrode disposed on one principal surface of the crystal element is expressed as t1, and a thickness of the excitation electrode disposed on the other principal surface of the crystal element is expressed as t2, while $t = t1 + t2$ is satisfied, $t1 = t2$ or $t1 \neq t2$ may be satisfied.

The thickness tx of the excitation electrode is an actually measured thickness, a thickness calculated by a well-known calculation formula from an actual frequency and a frequency constant (for example, 1670 when the crystal element is an AT-cut crystal element), or the like.

When the thickness T of the crystal element and the thickness tx of the excitation electrode are actually measured, the measurement may be performed at one point or multiple points in the crystal element, and may be performed at any position considering the measurement accuracy. In the case of the measurement at multiple points, an average value of measurement values at the multiple points is preferred to be used as the thickness.

In the crystal unit of the disclosure, a ratio of a mass of the excitation electrode to a mass of the crystal element may be used instead of the ratio t/T. That is, when a mass of a crystal in a region of the crystal element in which the excitation electrodes are disposed is expressed as M, and a mass of the excitation electrodes on the front and back surfaces in the region is expressed as m, a ratio m/M may be specified to from 0.192 to 0.216. In this case, the ratio m/M is more preferably from 0.199 to 0.209. In obtaining the mass of the excitation electrode, similarly to the case of the ratio t/T, the mass of the underlying metal film in the excitation electrode may be excluded, or may be taken into consideration.

With the ratio m/M in the range of from 0.192 to 0.216, the amount of frequency variation (that is, DLD characteristics) of the crystal unit when the drive level applied to the crystal unit is changed in the predetermined range can be suppressed to the range of ±6 ppm. With the ratio m/M in the range of from 0.199 to 0.209, the amount of frequency variation (that is, DLD characteristics) of the crystal unit when the drive level applied to the crystal unit is changed in the predetermined range can be suppressed to the range of ±4 ppm.

To embody the disclosure of the crystal unit, influences of the size and the planar shape of the crystal element on the present disclosure are low. This is because it is estimated that a structure enabling effectively trapping a vibration energy is provided at a lower side of the excitation electrode. Accordingly, it is estimated that the present disclosure is applicable to crystal elements having various kinds of sizes, shapes, and side ratios.

Also in the experimental result so far described above, it can be estimated that the influences of the size and the planar shape of the crystal element on the present disclosure are low. Specifically, the effect of the present disclosure can be confirmed in an AT-cut crystal element having a rectangular planar shape, long sides in a direction along an X-axis of the crystal, and short sides in a direction along a Z'-axis of the crystal, and having a long side dimension Lx in a range of from 0.826 mm to 0.869 mm and a short side dimension Wx in a range of from 0.587 mm to 0.635 mm. In this case, a crystal unit of 1.2 mm×1.0 mm, a crystal unit of what is called a 1210 size in a size of an outer shape of the container of the crystal unit can be achieved.

Furthermore, the effect of the present disclosure can be confirmed in a crystal element, which is smaller than above, having the long side dimension Lx of from 0.680 mm to 0.785 mm and the short side dimension Wx of from 0.466 mm to 0.520 mm. Therefore, the effect of the present disclosure can be obtained at least in the crystal element of these ranges. In this case, a crystal unit of 1.0 mm×0.8 mm, a crystal unit of what is called a 1008 size in the size of the outer shape of the container of the crystal unit can be achieved.

In the crystal element used in the experiment, a ratio Wx/Lx between the long side dimension Lx and the short side dimension Wx (that is, side ratio) is from 0.594 to 0.769. Therefore, the effect of the present disclosure can be obtained at least in the AT-cut crystal element having the side ratio in such a range.

To embody the disclosure of the crystal unit, influences of the size and the planar shape of the excitation electrode on the present disclosure are low. This is because it is estimated that a structure enabling effectively trapping a vibration energy is provided at a lower side of the excitation electrode. Accordingly, it is estimated that the present disclosure is applicable to excitation electrodes having various kinds of sizes and shapes.

Also in the experimental result so far described above, it can be estimated that the influences of the size and the planar shape of the excitation electrode on the present disclosure are low. Specifically, the effect of the present disclosure can be confirmed in an excitation electrode having a quadrilateral planar shape, a long side dimension Le in a range of from 0.46 mm to 0.54 mm and a short side dimension We in a range of from 0.22 mm to 0.30 mm, and further, in an excitation electrode having a long side dimension Le in a range of from 0.413 mm to 0.453 mm and a short side dimension We in a range of from 0.288 mm to 0.328 mm. Therefore, the effect of the present disclosure can be obtained at least in the excitation electrode having such sizes.

For a planar positional relation between the crystal element and the excitation electrode, the center of the crystal element may match the center of the excitation electrode, or the center of the excitation electrode may be decentered with respect to the center of the crystal element.

To embody the disclosure of the crystal unit, any oscillation frequency may be used. This is because it is estimated that a structure enabling effectively trapping a vibration energy is provided at a lower side of the excitation electrode. In the experimental result so far, the effect of the present disclosure can be confirmed for the oscillation frequency in a range of from 76 MHz to 80 MHz. Specifically, the effect of the present disclosure can be confirmed for each of the crystal units having the oscillation frequencies of 76.8 MHz, 79.96 MHz, and 80.00 MHz. Since each of the crystal units having the oscillation frequencies of 76.8 MHz, 79.96 MHz and 80 MHz can be used as a reference signal source or the like of, for example, a mobile terminal in, for example, the fifth generation mobile communication system, they are effective.

A semimanufactured crystal unit of the disclosure includes a wafer that includes a plurality of quartz-crystal vibrating pieces arranged in a matrix. The quartz-crystal vibrating pieces each include a crystal element and excitation electrodes disposed on front and back principal surfaces of the crystal element. In the quartz-crystal vibrating piece, the above-described ratio t/T is from 0.026 to 0.030, or the above-described ratio m/M is from 0.192 to 0.216.

More preferably, the semimanufactured crystal unit includes a wafer that includes a plurality of quartz-crystal vibrating pieces arranged in a matrix. In the quartz-crystal vibrating piece, the above-described ratio t/T is from 0.027 to 0.029 or the above-described ratio m/M is from 0.199 to 0.209.

To embody the disclosure of the semimanufactured crystal unit, the ranges of the ratio t/T and the ratio m/M may be taken into consideration as follows. In the manufacture of the crystal unit, generally, a crystal element on which an excitation electrode has been formed is mounted to a container, and subsequently, the excitation electrode is removed by ion milling little by little, thus adjusting the frequency of the crystal unit to a desired frequency. Therefore, the thickness of the excitation electrode is different between the crystal unit as a final product and the semimanufactured crystal unit by an amount of the frequency adjustment. Therefore, when the frequency adjustment is performed by the ion milling, the thickness of the excitation electrode is often slightly thicker in the semimanufactured crystal unit than in the crystal unit as a final product. Accordingly, since the ranges of the ratio t/T and the ratio m/M of the semimanufactured crystal unit are shifted by the amount of the frequency adjustment in some cases, it is preferred to take the point into consideration for the semimanufactured crystal unit. The shift amount is approximately 0.0005 for the ratio t/T, and approximately 0.004 for the ratio m/M.

A method for manufacturing a crystal unit of the disclosure includes: obtaining a correlation between a ratio t/T and a drive level characteristic when a thickness of a crystal element that vibrates in a thickness-shear mode is expressed as T, and a total thickness of excitation electrodes disposed on front and back surfaces of the crystal element is expressed as t, or obtaining a correlation between a ratio m/M and the drive level characteristic when a mass of the crystal in a region of the crystal element in which the excitation electrodes are disposed is expressed as M, and a mass of the excitation electrodes on the front and back surfaces in the region is expressed as m; obtaining a range of the total thickness t or a range of the mass m from the obtained correlation so as to have the drive level characteristic in a desired range; and forming the excitation electrodes on the crystal element so as to have the total thickness t or the mass m in the obtained range.

With the crystal unit of the disclosure, since the thickness t of the excitation electrode is set in the appropriate range relative to the thickness T of the crystal element, or the mass m of the excitation electrode is set in the appropriate range relative to the mass M of the crystal element, the crystal unit and the semimanufactured crystal unit excellent in drive level characteristics compared with a case without such a setting can be provided.

According to the method for manufacturing a crystal unit of the disclosure, since the appropriate thickness or the appropriate mass of the excitation electrode is obtained while focusing on the ratio t/T or the ratio m/M, and the excitation electrode corresponding to the obtained appropriate thickness or appropriate mass is formed on the crystal element, the crystal unit excellent in drive level characteristics can be easily manufactured.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal unit comprising:
   a crystal element that vibrates in a thickness-shear mode;
   excitation electrodes disposed on front and back surfaces of the crystal element; and
   a container to which the crystal element is mounted, the excitation electrodes being disposed on the crystal element, wherein
   when a thickness of the crystal element is expressed as T, and a total thickness of the excitation electrodes disposed on the front and back surfaces of the crystal element is expressed as t, a ratio t/T is from 0.026 to 0.030.

2. The crystal unit according to claim 1, wherein the ratio t/T is from 0.027 to 0.029.

3. The crystal unit according to claim 1, wherein the crystal element is an AT-cut crystal element.

4. The crystal unit according to claim 3, wherein the crystal unit is a crystal unit having any frequency in an oscillation frequency band of from 76 MHz to 80 MHz.

5. The crystal unit according to claim 3, wherein the crystal unit is a crystal unit having an oscillation frequency of 76.8 MHz.

6. The crystal unit according to claim 3, wherein the crystal unit is a crystal unit having an oscillation frequency of 79.96 MHz.

7. The crystal unit according to claim 3, wherein the crystal unit is a crystal unit having an oscillation frequency of 80 MHz.

8. The crystal unit according to claim 3, wherein the crystal element is an AT-cut crystal element having a rectangular planar shape, the crystal element has a long side parallel to an X-axis of the crystal and a short side parallel to a Z'-axis of the crystal, and a ratio Wx/Lx between a long side dimension Lx and a short side dimension Wx is from 0.690 to 0.745.

9. A crystal unit comprising:
   a crystal element that vibrates in a thickness-shear mode;
   excitation electrodes disposed on front and back surfaces of the crystal element; and
   a container to which the crystal element is mounted, the excitation electrodes being disposed on the crystal element, wherein
   when a mass of a crystal in a region of the crystal element in which the excitation electrodes are disposed is expressed as M, and a mass of the excitation electrodes on the front and back surfaces in the region is expressed as m, a ratio m/M is from 0.192 to 0.216.

10. The crystal unit according to claim 9, wherein the ratio m/M is from 0.199 to 0.209.

11. A semimanufactured crystal unit comprising
    a wafer that includes a plurality of quartz-crystal vibrating pieces arranged in a matrix, wherein
    the quartz-crystal vibrating pieces each include a crystal element and excitation electrodes disposed on front and back principal surfaces of the crystal element, and
    when a thickness of the crystal element is expressed as T, and a total thickness of the excitation electrodes disposed on the front and back surfaces of the crystal element is expressed as t, or when a mass of a crystal in a region of the crystal element in which the excitation electrodes are disposed is expressed as M, and a mass of the excitation electrodes on the front and back surfaces in the region is expressed as m, a ratio t/T is from 0.026 to 0.030, or a ratio m/M is from 0.192 to 0.216.

12. The semimanufactured crystal unit according to claim 11, wherein
    the semimanufactured crystal unit uses an AT-cut quartz-crystal wafer.

13. A method for manufacturing the crystal unit according to claim 1, comprising:
    obtaining a correlation between a ratio t/T and a drive level characteristic when a thickness of a crystal element that vibrates in a thickness-shear mode is expressed as T, and a total thickness of excitation electrodes disposed on front and back surfaces of the crystal element is expressed as t;
    obtaining a range of the total thickness t from the obtained correlation so as to have the drive level characteristic in a desired range; and
    forming the excitation electrodes on the crystal element so as to have the total thickness t in the obtained range.

14. The method for manufacturing a crystal unit according to claim 13, wherein
    the crystal element is an AT-cut crystal element.

15. A method for manufacturing the crystal unit according to claim 9, comprising:
- obtaining a correlation between a ratio m/M and a drive level characteristic when a mass of the crystal in a region of the crystal element in which the excitation electrodes are disposed is expressed as M, and a mass of the excitation electrodes on the front and back surfaces in the region is expressed as m;
- obtaining a range of the mass m from the obtained correlation so as to have the drive level characteristic in a desired range; and
- forming the excitation electrodes on the crystal element so as to have the mass m in the obtained range.

16. The method for manufacturing a crystal unit according to claim 15, wherein
the crystal element is an AT-cut crystal element.

* * * * *